(12) United States Patent
Nagumo

(10) Patent No.: US 8,836,743 B2
(45) Date of Patent: Sep. 16, 2014

(54) DRIVE DEVICE, PRINT HEAD AND IMAGE FORMING APPARATUS

(75) Inventor: Akira Nagumo, Tokyo (JP)

(73) Assignee: Oki Data Corporation, Tokyo (JP)

( * ) Notice: Subject to any disclaimer, the term of this patent is extended or adjusted under 35 U.S.C. 154(b) by 169 days.

(21) Appl. No.: 13/070,006

(22) Filed: Mar. 23, 2011

(65) Prior Publication Data

US 2011/0234743 A1 Sep. 29, 2011

(30) Foreign Application Priority Data

Mar. 24, 2010 (JP) ................. 2010-067335

(51) Int. Cl.
*B41J 2/385* (2006.01)
*B41J 2/39* (2006.01)
*B41J 2/47* (2006.01)
*B41J 2/45* (2006.01)
*B41J 2/435* (2006.01)
*H01L 25/075* (2006.01)
*G06K 15/12* (2006.01)
*H01L 33/00* (2010.01)

(52) U.S. Cl.
CPC ............. B41J 2/435 (2013.01); H01L 25/0753 (2013.01); *H01L 33/0016* (2013.01); G06K 15/1238 (2013.01); *H01L 2224/48091* (2013.01); *H01L 2924/10253* (2013.01); *H01L 2924/3011* (2013.01)
USPC ........... 347/238; 347/132; 347/141; 347/237; 347/247

(58) Field of Classification Search
CPC ............................ B41J 2/45; B41J 2002/453
USPC .......................... 347/132, 141, 237, 238, 247
See application file for complete search history.

(56) References Cited

U.S. PATENT DOCUMENTS

| | | | | |
|---|---|---|---|---|
| 5,969,744 A | * | 10/1999 | Sakashita et al. | ............. 347/237 |
| 2005/0001270 A1 | * | 1/2005 | Esmark et al. | ................ 257/355 |
| 2009/0295901 A1 | * | 12/2009 | Nagumo | ....................... 347/130 |

FOREIGN PATENT DOCUMENTS

| | | |
|---|---|---|
| JP | 9-240057 A | 9/1997 |
| JP | 10-50860 A | 2/1998 |
| JP | 2001-287393 A | 10/2001 |
| JP | 2009-289836 A | 12/2009 |

* cited by examiner

*Primary Examiner* — Justin Seo
*Assistant Examiner* — Kendrick Liu
(74) *Attorney, Agent, or Firm* — Marvin A. Motsenbocker; Mots Law, PLLC

(57) ABSTRACT

A drive device to drive a plurality of three-terminal light emitting elements includes a drive circuit. The drive circuit includes a first and second conductive type MOS transistor complementarily connected to each other and configured to drive three-terminal light emitting elements that are in conduction state based on a received drive signal. The first conductive type MOS transistor is formed in a substrate region and includes a channel formation region, which is a region wherein a channel is to be formed. An impurity with the same polarity as that of the substrate region is injected in the channel formation region.

11 Claims, 13 Drawing Sheets

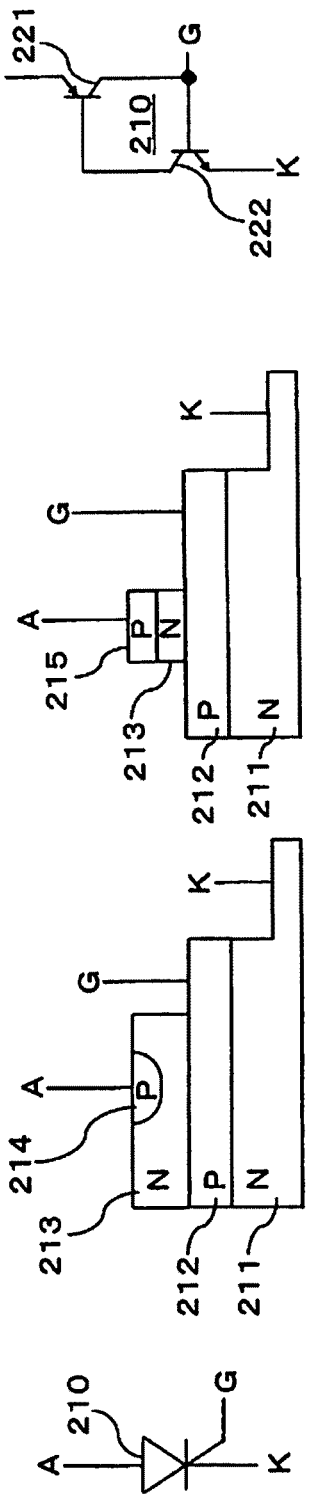

DRIVE DEVICE, PRINT HEAD AND IMAGE FORMING APPARATUS

CROSS REFERENCE TO RELATED APPLICATIONS

This application claims priority based on 35 USC 119 from prior Japanese Patent Application No. 2010-067335 filed on Mar. 24, 2010, entitled "DRIVE DEVICE, PRINT HEAD AND IMAGE FORMING APPARATUS", the entire contents of which are incorporated herein by reference.

BACKGROUND OF THE INVENTION

1. Field of the Invention

The invention relates to a drive device which selectively and cyclically drives a group of three-terminal light emitting elements such as light emitting thyristors, a print head including the drive device, and an image forming apparatus such as an electrophotographic printer including the print head.

2. Description of Related Art

Conventionally, as a drive device provided in an image forming apparatus such as an electrophotographic printer, the following configuration has been known for driving a light emitting thyristor array in which a large number of light emitting thyristors are arranged. The configuration includes a complementary MOS (hereinafter, referred to as "CMOS") inverter having a CMOS transistor and includes a current limiting resistor. In this configuration, the CMOS inverter supplies drive current to an anode of the light emitting thyristor array via the current limiting resistor (for example, Japanese patent application publication No. 2001-287393). The current limiting resistor and the anode of the light emitting thyristor array are connected with each other through, for example, a connecting cable.

SUMMARY OF THE INVENTION

Conventional drive devices, print heads and image forming apparatuses, however, have a problem that the drive current oscillates in a negative resistance region of the light emitting thyristors since the resistance value of the current limiting resistor in the drive device is lower than the absolute value of the negative resistance of the light emitting thyristor. In addition, the oscillation phenomenon occurs at the rising and falling portions of the drive current, whereby the substantial drive pulse width of the drive current fluctuates and causes the exposure energy to change.

A first aspect of the invention is a drive device configured to drive a plurality of three-terminal light emitting elements. Each three-terminal light emitting element includes: a first terminal connected to a first power supply; a second terminal configured to enable drive current flow to the first terminal from the second terminal; and a first control terminal configured to control the conduction state between the first terminal and the second terminal; wherein the first terminals of the plurality of three-terminal light emitting elements being connected in common, and the second terminals of the plurality of three-terminal light emitting elements being connected in common. The drive device includes a drive circuit, including a first conductive type MOS transistor and a second conductive type MOS transistor having a polarity different from that of the first conductive type MOS transistor, the first conductive type MOS transistor and the second conductive type MOS transistor being complementarily connected to each other, and configured to drive, based on a received drive signal, three-terminal light emitting elements that are in a conduction state among the plurality of three-terminal light emitting elements. The first conductive type MOS transistor is formed in a substrate region and includes: a third terminal connected to a second power supply having a potential different from the potential of the first power supply; a fourth terminal connected to the second terminals of the plurality of three-terminal light emitting elements connected in common; a second control terminal configured to control the conduction state between the third terminal and the fourth terminal based on the drive signal; and a channel formation region, which is a region wherein a channel is to be formed, having an impurity with the same polarity as that of the substrate region injected therein.

The three-terminal light emitting element may be a light emitting thyristor, and an equivalent resistance value of the drive circuit may be set to a value higher than an absolute value of negative resistance determined on the turn-on characteristic of the light emitting thyristor.

A second aspect of the invention is a print head including the plurality of three-terminal light emitting elements and the drive device according to the first aspect.

A third aspect of the invention is an image forming apparatus including the print head according to the second aspect to emit light to form an image on a recording medium.

According to the first and second aspects, the drive device includes the drive circuit including the first conductive type MOS transistor and the second conductive type MOS transistor to drive three-terminal light emitting elements and the impurity of the same polarity as that of the substrate region is injected in the channel formation region of the first conductive type MOS transistor. This configuration increases the threshold voltage of the first conductive type MOS transistor so as to achieve constant current driving of the three-terminal light emitting elements by the first conductive type MOS transistor operating in a saturation region. Therefore, the output resistance value of the drive circuit can be greater than the absolute value of a negative resistance value of the three-terminal light emitting elements, thereby preventing oscillation of the drive circuit.

According to the third aspect, the image forming apparatus is provided with the print head of the second aspect. Thus, the image forming apparatus prevents variations of exposure energy and thereby achieves high-quality image formation without non-uniform print density.

BRIEF DESCRIPTION OF THE DRAWINGS

FIGS. 6A to 6D are diagrams illustrating a configuration of light emitting thyristor 210 shown in FIG. 1.

DETAILED DESCRIPTION OF EMBODIMENTS

Figure 1:
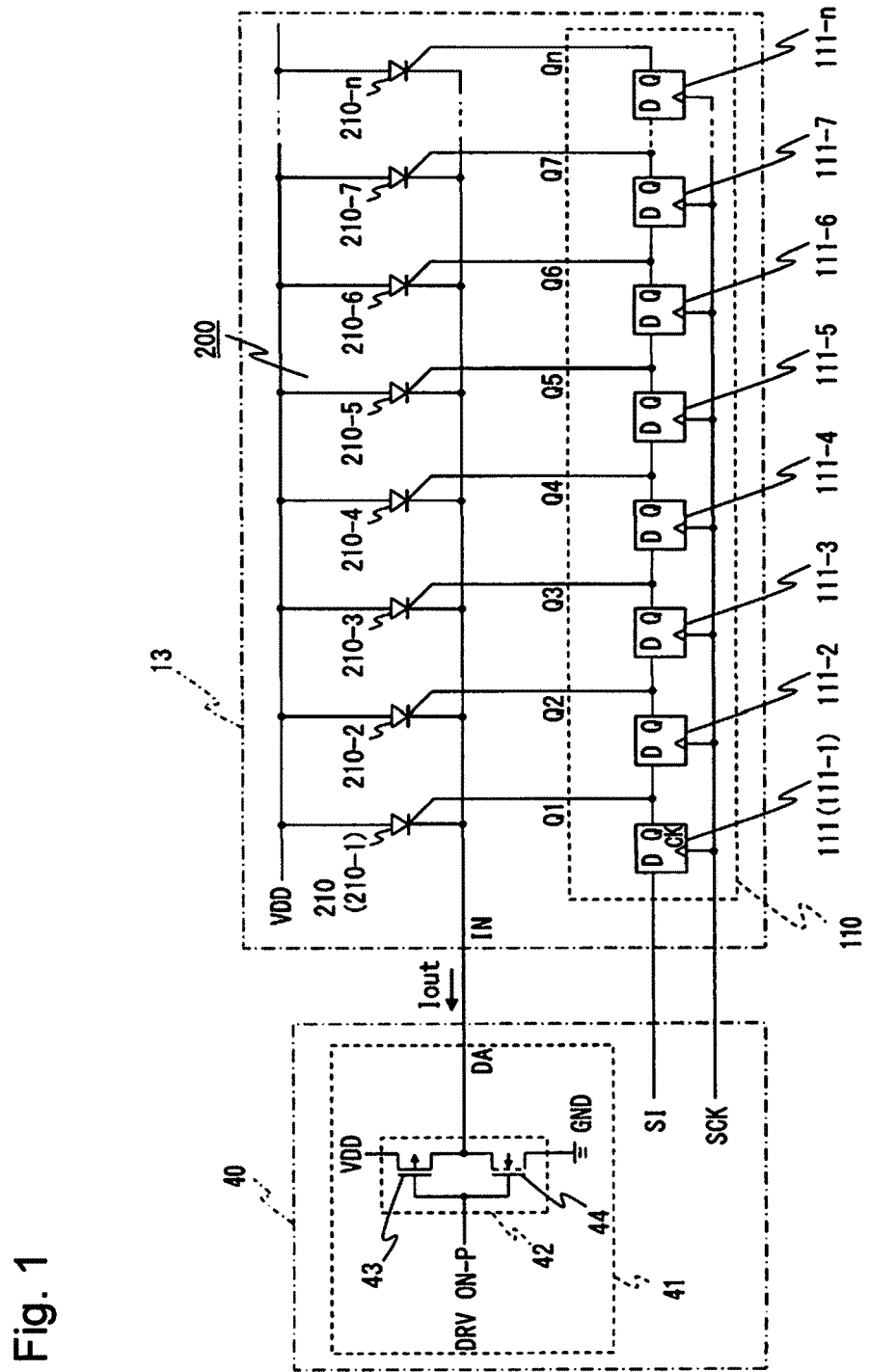
FIG. 1 is a block diagram illustrating a circuit configuration of a printing controller and a print head shown in FIG. 5 according to Embodiment 1 of the invention.

Descriptions are provided herein below for embodiments based on the drawings. In the respective drawings referenced herein, the same constituents are designated by the same reference numerals and duplicate explanation concerning the same constituents is omitted. All of the drawings are provided to illustrate the respective examples only.

Embodiment 1
(Image Forming Apparatus According to Embodiment 1)

Figure 2:
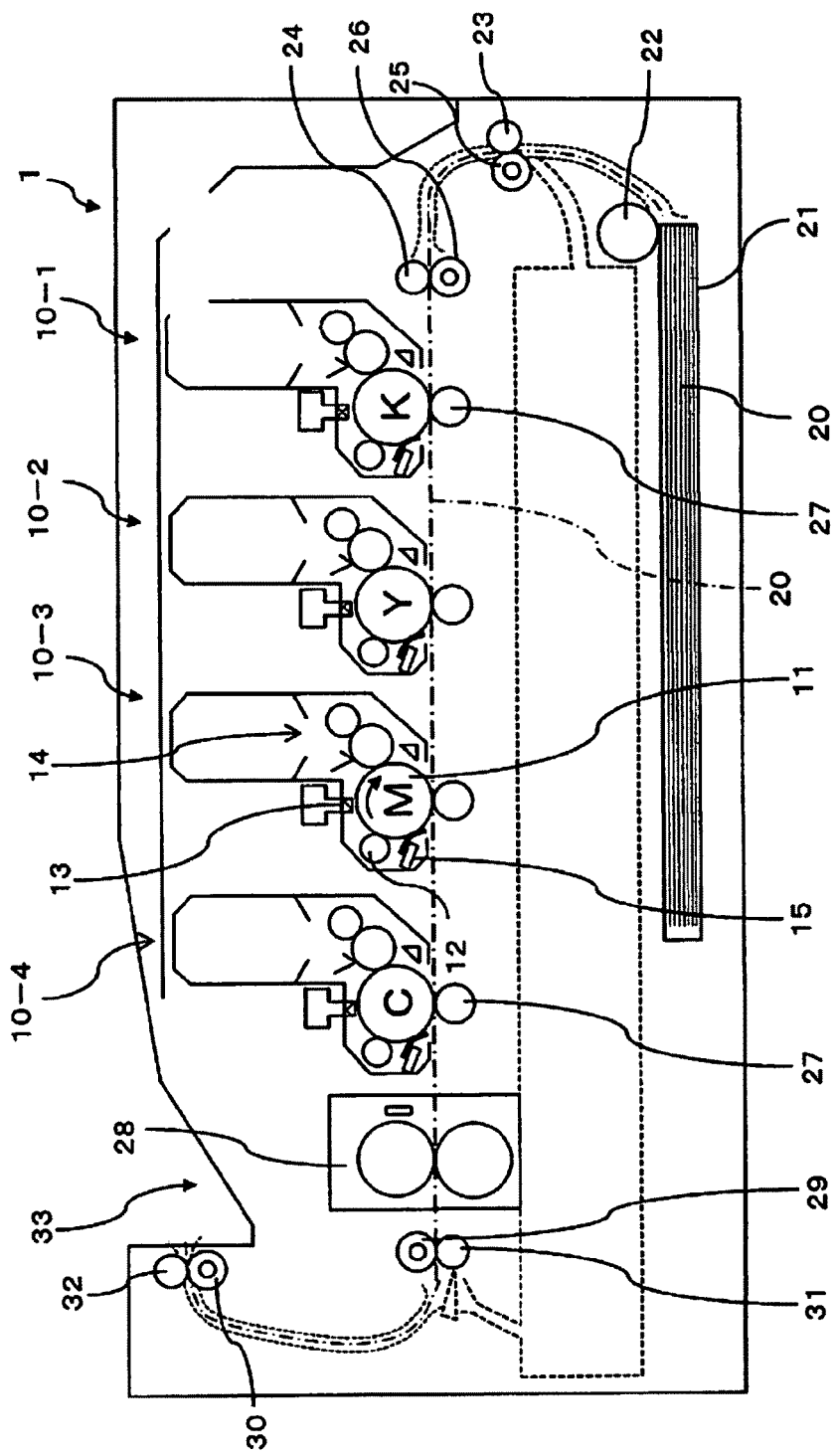
FIG. 2 is a schematic configuration diagram illustrating an image forming apparatus according to Embodiment 1 of the invention.

FIG. 2 is a schematic configuration diagram of an image forming apparatus according to Embodiment 1 of the invention.

Image forming apparatus 1 is a tandem type electrophotographic color printer provided with an exposure device (for example, a print head) including a light emitting element array as a three-terminal switch element array using driven elements (for example, light emitting thyristors each of which is a three-terminal switch element as a light emitting element). Image forming apparatus 1 includes four process units 10-1 to 10-4, which are disposed in that order from upstream of the transport path of recording medium 20 (for example, paper) so as to respectively form black (K), yellow (Y), magenta (M) and cyan (c) images. The common internal configuration of process units 10-1 to 10-4 is described by citing process unit 10-3 for magenta as an example.

Process unit 10-3 includes photosensitive body 11 (for example, photosensitive drum) as an image carrier which is rotatably disposed in the arrow direction shown in FIG. 2. Photosensitive drum 11 is surrounded by, in the order from upstream of the rotating direction thereof, electrification device 12 which charges photosensitive body 11 by supplying charge to the surface thereof and print head 13 as the exposure device forming an electrostatic latent image on the surface of charged photosensitive body 11 by selectively irradiating light thereto. Further, on the surface of photosensitive body 11 where the electrostatic latent image is formed, development unit 14 generates a visible image as a toner image (a developer image) by applying toner (developer) of the specified color (for example, magenta) and cleaning device 15 removes toner residing on photosensitive body 11 after transfer of the visible image to recording medium 20. Further, drums or rollers used in such devices rotate with power transmitted from drive sources (not shown) via gear or the like.

At the bottom of image forming apparatus 1, paper cassette 21 storing accumulated paper 20 is mounted, and hopping roller 22 carrying paper 20 one by one is disposed thereupon. On the downstream side of hopping roller 22 in a direction of carrying paper 20, carriage roller 25 which carries paper 20 held by pinch rollers 23 and 24, and resist roller 26 carrying paper 20 to process unit 10-1 while correcting inclination of paper 20 are disposed. Hopping roller 22, carriage roller 25 and resist roller 26 are rotated with power transmitted from a drive source (not shown) via gear or the like.

Transfer rollers 27, or a transfer unit, made of semi-conductive material or the like are disposed opposite to photosensitive drums 11 of process units 10-1 to 10-4, respectively. Potential is applied to each of transfer rollers 27 so as to provide a potential difference between photosensitive drums 11 and transfer rollers 27 to transfer the visible toner images from photosensitive drums 11 onto paper 20. Fixing unit 28 is disposed downstream of process unit 10-4.

Fixing unit 28 is a device including a heating roller and a backup roller configured to fix toner transferred onto paper 20 by pressure and heat. Downstream of fixing unit 28 are provided discharge rollers 29 and 30 and pinch rollers 31 and 32 of the discharge portion and paper stacker 33. Discharge rollers 28 and 30 hold paper 20, discharged from fixing unit 28, in conjunction with pinch rollers 31 and 32 of the discharge portion and carry it to paper stacker 33. Fixing unit 28, discharge roller 29 and the like are rotated by power transmitted from a drive source (not shown) via gears or the like.

Image recording apparatus 1 thus configured operates as described below.

First, paper 20 stored in paper cassette 21 is sequentially fed from the top of the paper stack by feed roller 22. Then, paper 20 is transported between photosensitive body 11 of process unit 10-1 and transfer roller 27 while being held by carriage roller 25, resist roller 26 and pinch rollers 23 and 24. Thereafter, paper 20 is held by photosensitive body 11 and transfer roller 27, a toner image is transferred onto the surface thereof, and simultaneously, paper 20 is transported by rotation of photosensitive body 10-1. Similarly, paper 20 passes through process units 10-2 to 10-4 sequentially while toner images of respective colors of the electrostatic latent image formed by print heads 13 are developed by developers 14 and overlapped by their sequential transfer onto the recording surface thereof.

After toner images of respective colors are overlapped on the recording surface of the paper in this way, paper 20 on which the toner images are fixed by fixing unit 28 is discharged to paper stacker 33 outside image forming apparatus 1 while being held by discharge rollers 29 and 30 and pinch rollers 31 and 32. A color image is formed on paper 20 through the process described above.

(Print Head According to Embodiment 1)

Figure 3:
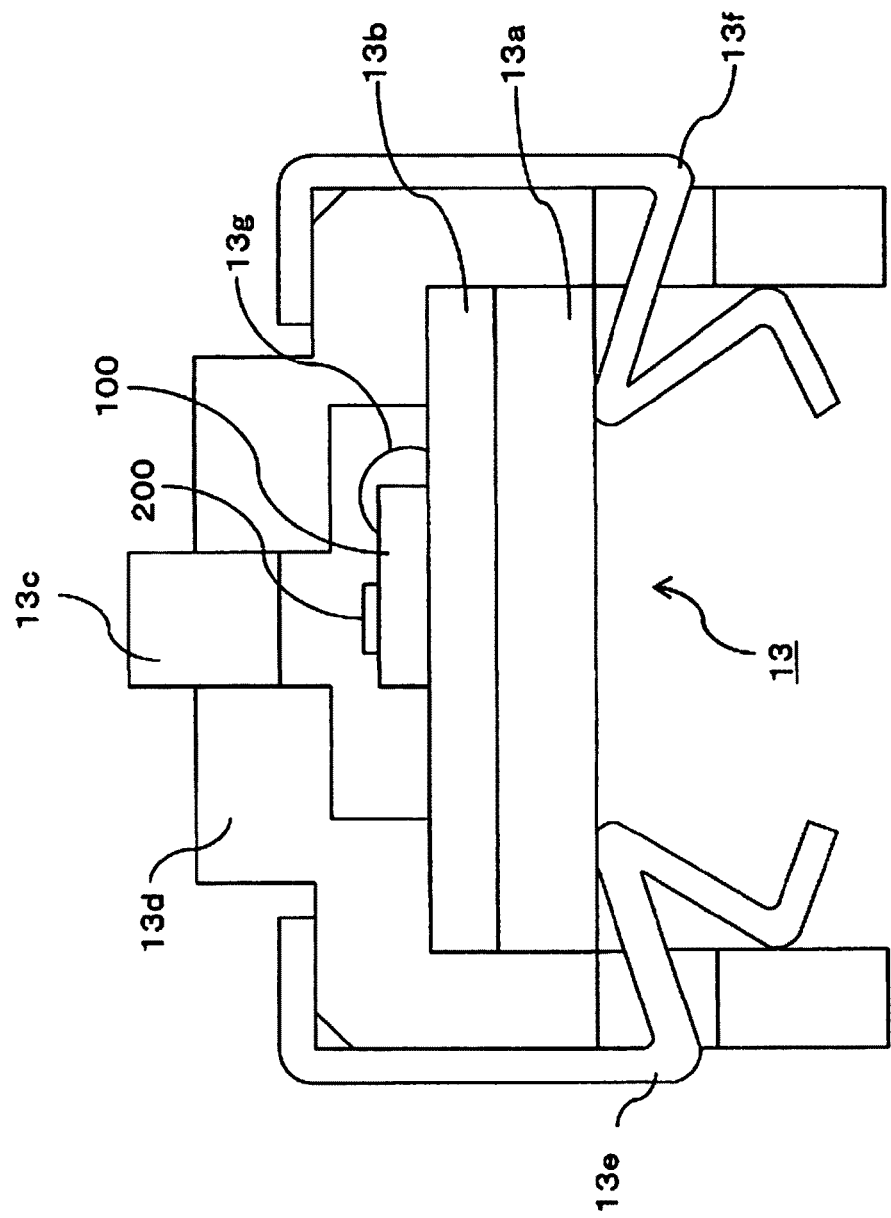
FIG. 3 is a schematic cross section illustrating a configuration of print head 13 shown in FIG. 2.
Figure 4:
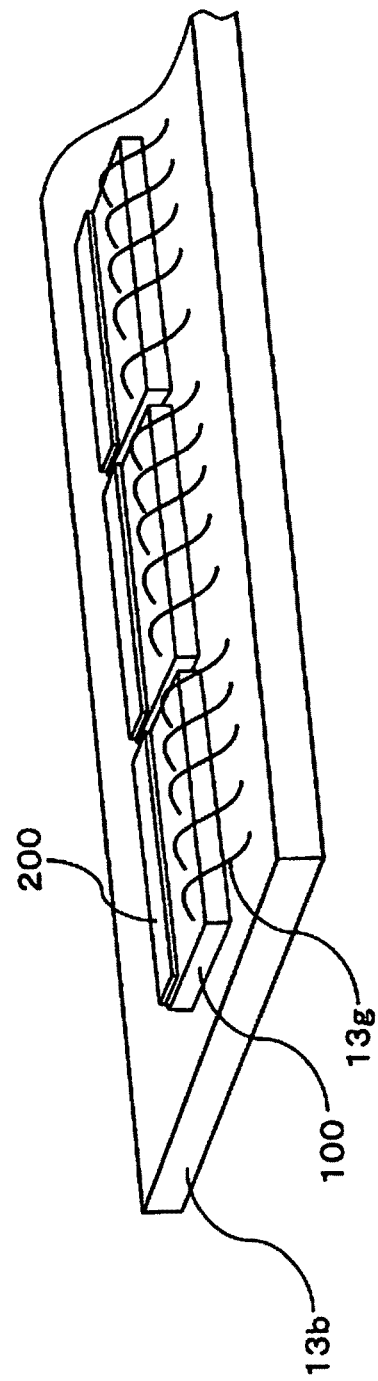
FIG. 4 is a perspective view of a substrate unit shown in FIG. 3.

FIG. 3 is a schematic cross section illustrating a configuration of print head 13 shown in FIG. 2. FIG. 4 is a perspective view of a substrate unit shown in FIG. 3.

Print head 13 shown in FIG. 3 includes base material 13a, on which a substrate unit shown in FIG. 4 is fixed. The substrate unit includes: printed substrate 13b fixed on base material 13a with an adhesive or the like; a plurality of integrated circuits 100 (hereinafter, referred to as IC) on which shift registers are integrated; and light emitting element arrays 200 including a plurality of chip-shaped light emitting element strings (for example, light emitting thyristor strings) fixed on IC chips 100 with an adhesive or the like. Light emitting element arrays 200 and IC chips 100 are electrically connected to each other by means of thin film wires (not shown) or the like. Further, a plurality of terminals in IC chips 100 and wiring pads (not shown) on printed substrate 13b are electrically connected with each other by means of bonding wires 13g.

On the plurality of light emitting element arrays 200, lens array (for example, rod lens array) 13c formed by multiple arrays of columnar optical elements is disposed, and rod lens array 13c is fixed with holders 13d. Base element 13a, printed substrate 13b and holders 13d are fixed with clamp elements 13e and 13f.

(Printer Control Circuit According to Embodiment 1)

Figure 5:
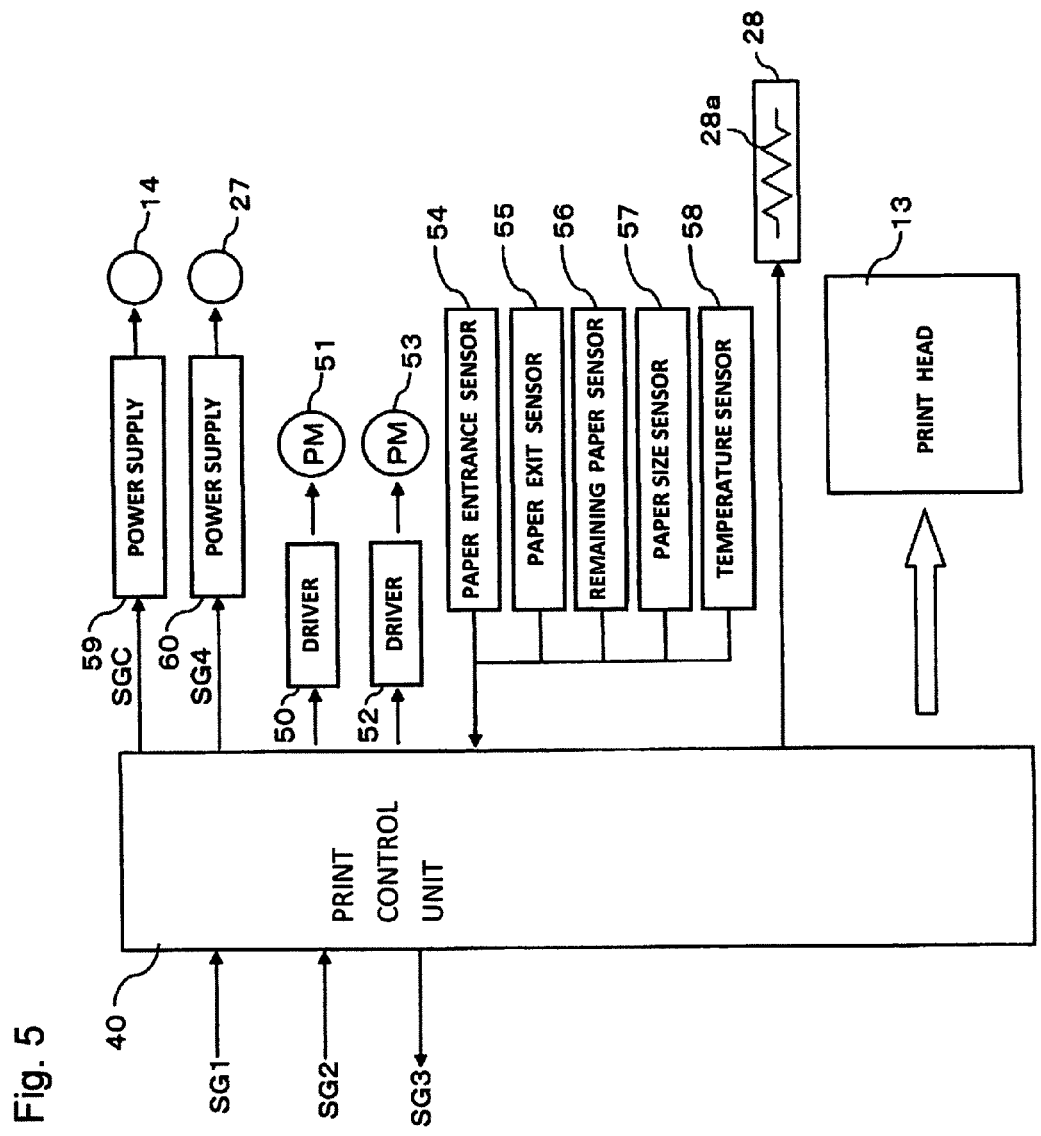
FIG. 5 is a block diagram illustrating a configuration of a printer control circuit in image forming apparatus 1 shown in FIG. 2.

FIG. 5 is a block diagram illustrating a configuration of a printer control circuit in image forming apparatus 1 shown in FIG. 2.

The printer control circuit includes printing controller 40 disposed inside a printing unit of image forming apparatus 1. Printing controller 40 includes a microprocessor, a read only memory (ROM), a random access memory (RAM), input and output ports for signal input and output, a timer, and the like, and is provided with a function to perform printing by executing sequential control over the printer as a whole with upper-level controller's control signal SGI (not shown), video signal SG2 (one-dimensionally arrayed dot map data) and the like. Connected to printing controller 40 are four print heads 13 of process units to 10-1 to 10-4, heater 28a of fixing unit 28, drivers 50 and 52, paper intake port sensor 54, paper discharge port sensor 55, residual paper quantity sensor 56, paper size sensor 57, fixing unit temperature sensor 58, charging high-voltage power supply 59, transfer high-voltage power supply 60, and the like. Development and transfer process motor (PM) 51 is connected to driver 50, paper feed motor (PM) 53 is connected to driver 52, developer 14 is connected to charging high-voltage power supply 59, and transfer roller 27 is connected to transfer high-voltage power supply 60.

The printer control circuit of such configuration operates as described below.

Upon receiving a printing command by control signal SG1 transmitted from an upper-level controller, printing controller 40 first detects with temperature sensor 58 whether or not heater 28a in fixing unit 28 is within an operable temperature range, and if not within the operable temperature range, turns heater 28a on to heat fixing unit 28 up to the operable temperature. Then, printing controller 40 rotates development and transfer process motor 51 via driver 50 and simultaneously turns charging high-voltage power supply 59 on with charge signal SGC to charge developer 14.

Then, existence and/or non-existence and type of paper 20 shown in FIG. 2 is detected by residual paper quantity sensor 56 and paper size sensor 57, and paper feed corresponding to paper 20 starts. Here, paper feed motor 53 can be rotated in both directions via driver 52. Paper feed motor 53 first rotates reversely and then feeds mounted paper 20 by a predetermined amount only until detected by paper intake port sensor 54. Then, paper feed motor 53 rotates forward to carry paper 20 into a printing mechanism of the printer.

When paper 20 reaches a printable position, printing controller 40 transmits timing signal SG3 (including main scanning synchronization signal and sub scanning synchronization signal) to an image processor (not shown) and receives video signal SG2. Video signal SG2, which is edited per page in the image processor and received by printing controller 40, is transferred to print heads 13 as printing data. Each of print heads 13 is configured as a plurality of light emitting thyristors arranged linearly, each of which being for 1-dot (pixel).

Transmission and reception of video signal SG2 is performed per printing line. According to information to be printed, print heads 13 forms the latent image as high potential dots on photosensitive drums 11 (not shown) charged to a negative potential. Then, in developer 14, image forming toner charged to a negative potential is attracted to the dots by electric attraction to form a toner image.

Then, the toner image on photosensitive drum 11 is transported to a position opposite to transfer roller 27, while transfer high-voltage power supply 60 is put in the ON state with respect to positive potential by transfer signal SG4, and thus transfer roller 27 transfers the toner image onto paper 20 which passes between photosensitive drum 11 and transfer roller 27. Paper 20 containing the transferred toner image is carried in contact with fixing unit 28 incorporating heater 28a such that the toner image is fixed on paper 20 with heat applied by fixing unit 28. Paper 20 containing the fixed image is further carried from the printing mechanism of the printer and discharged outside of the printer through paper discharge port sensor 55.

In response to detection by paper size sensor 57 and paper intake port sensor 54, printing controller 40 applies voltage from transfer high-voltage power supply 60 to transfer roller 27 only when paper 20 passes through transfer roller 27. When printing ends and paper 20 passes through paper discharge port sensor 55, printing controller 40 ends application of voltage to developer 14 by charging high-voltage power supply 59 and simultaneously stops rotation of development and transfer process motor 51. Thereafter, operations described above are repeated.

(Printing Controller and Print Head According to Embodiment 1)

FIG. 1 is a block diagram illustrating a schematic circuit configuration of printing controller 40 and print head 13 shown in FIG. 5 according to Embodiment 1 of the invention.

Print head 13 includes light emitting element array 200 and shift register 110 formed in IC chip 100.

Shift register 110 is a circuit including a plurality of flip-flop circuits (hereinafter, referred to as "FF") 111 (111-1 to 111-n), which supply trigger signals (for example, trigger current) to turn light-emitting element array 200 on and off. Each of FF111 includes input terminal D for data input, output terminal Q for data output and clock terminal CK for input of serial clock signal (hereinafter, referred to as "serial clock") SCK. Input terminal D of a first-stage FF111-1 receives serial data SI, and output terminal Q of the FF111-1 is connected to input terminal D of a second-stage FF111-2. Thereafter, input and output terminals of subsequent stages are connected in the same way up to a final-stage FF111-n.

Shift register 110 is configured such that when serial clock SCK and serial data SI is fed from printing controller 40, shift register 110 inputs and shifts serial data SI sequentially from first-stage FF111-1 to final-stage FF111-n in synchronization with serial clock SGK and outputs shifted data through output terminals Q1 to Qn of each stage.

Shift register 110 is fabricated, for example, using a known CMOS structure on a silicon wafer substrate, or alternatively, using a known thin film transistor (TFT) on a glass substrate.

Light emitting element array 200 includes, for example, a plurality of P gate type light emitting thyristors 210 (210-1 to 210-n, . . . ) which are three-terminal light emitting elements. In each of the light emitting thyristors 210, a first terminal thereof (for example, anode) is connected to a first power supply (for example, VDD power supply), a second terminal (for example, cathode) is connected to common terminal IN through which drive current Iout flows, and a first control terminal (for example, gate) is connected to a corresponding one of output terminals Q1 to Qn, . . . of shift register 110. Light emitting thyristors 210 are elements which emit light, with supply voltage VDD applied between the anode and the cathode when the trigger current is input to the gate and thereby the anode-to-cathode is turned on causing the cathode current. For a print head capable of printing with 600 dots resolution per inch on A4 size paper, for example, 4992 light emitting thyristors 210-1 to 210-n, . . . are arrayed in total.

Printing controller 40 includes: circuits (not shown) which provide, to print head 13, ON/OFF command signal DRVON-P (note that, "-P" represents a positive logic) instructing ON/OFF of light emitting element arrays 200, and serial data SI and serial clock SCK, which are control signals with respect to shift register 110; a plurality of drive circuits 41 which drive a plurality of light emitting element arrays 200 in a time division manner; VDD power supply; second power supply (ground GND=0V); and the like. In FIG. 1, only one drive circuit 41 is shown in order to simplify the description. The plurality of light emitting element arrays 200 include, for example, a total of 4992 light emitting thyristors 210-1 through 210-n, and are configured such that a plurality of light emitting thyristor sets are grouped and divided drive of drive circuit 41 provided each per group is performed in parallel in real time.

A drive device according to Embodiment 1 includes drive circuits 41 on the side of printing controller 40 and shift registers 110 on the side of print head 13.

Citing a typical design as an example, 26 chips of light emitting element array 200 formed by arranging 192 light emitting thyristor 210 (210-1 to 210-n) are regularly positioned on printed substrate 13b shown in FIG. 4. This configuration includes a total of 4992 light emitting thyristors 210-1 to 210-n, . . . required for print head 13. Drive circuits 41 are disposed in association with 26 light emitting element arrays 200 described above, and the total number of output terminals of drive circuits 41 is 26. Although FIG. 1 shows drive circuit 41 disposed inside printing controller 40, drive circuit 41 may be disposed in print head 13.

Drive circuit 41 includes CMOS inverter 42 which inverts and then outputs ON/OFF command signal DRVON-P to data terminal DA. CMOS inverter 42 includes second conductive type MOS transistor (for example, P-channel MOS transistor, hereinafter referred to as "PMOS") 43 and first conductive type MOS transistor (for example, N-channel MOS transistor, hereinafter referred to as "NMOS") 44, which are connected in series with each other between the VDD power supply and ground GND.

That is, in PMOS 43, ON/OFF command signal DRVON-P is input to a gate, a source is connected to the VDD power supply, and a drain is connected to data terminal DA. In NMOS 44, ON/OFF command signal DRVON-P is input to a second control terminal (for example, a gate), a third terminal (for example, a source) is connected to ground GND, and a fourth terminal (for example, a drain) is connected to data terminal DA. Data terminal DA is connected to common terminal IN on the side of light emitting element array 200.

(Light Emitting Thyristor According to Embodiment 1)

FIGS. 6A to FIG. 6D are configuration diagrams illustrating light emitting thyristor 210 shown in FIG. 1.

FIG. 6A shows circuit symbols of light emitting thyristor 210 having three terminals including anode A, cathode K and gate G.

FIG. 6B is a diagram illustrating the cross-sectional structure of light emitting thyristor 210. Light emitting thyristor 210 is fabricated by epitaxially growing a predetermined crystal on an upper layer of, for example, GaAs wafer substrate by a known MO-CVD (Metal Organic-Chemical Vapor Deposition) technique.

That is, after epitaxial growth of a predetermined buffer layer and sacrifice layer (not shown), a wafer of an NPN three-layer structure including N-type layer 211 containing an N-type impurity, P-type layer 212 containing a P-type impurity and N-type layer 213 containing an N-type impurity formed sequentially on an AlGaAs material. Then, using a known photolithography technique, P-type impurity region 214 is formed selectively at a portion of topmost N-type layer 213. Further, a groove section (not shown) is formed by a known etching technique to separate elements. Further, in the above-described etching process, a portion of N-type region 211 which becomes a bottom layer of light emitting thyristor 210 is exposed, and a metal wire is formed at the exposed region to form cathode K. Simultaneously, anode A and gate G are formed respectively at P-type region 214 and P-type region 212.

FIG. 6C is a cross-sectional structure diagram illustrating another aspect of light emitting thyristor 210. Light emitting thyristor 210 of this cross-sectional structure is fabricated through epitaxial growth of a predetermined crystal on an upper layer of, for example, a GaAs substrate by a known MO-CVD technique.

That is, after epitaxial growth of a predetermined buffer layer and sacrifice layer (now shown), an wafer of a PNPN four-layer structure is formed by sequentially forming N-type layer 211 containing an N-type impurity, P-type layer 212 containing a P-type impurity, N-type layer 213 containing an N-type impurity and P-type layer 215 containing a P-type impurity on an AlGaAs material. Further, a groove section (not shown) is formed using a known etching technique to separate elements. Further, in the etching process described above, a portion of N-type region 211 which becomes a bottom layer of light emitting thyristor 210 is exposed, and a metal wire is formed at the exposed region to form cathode K. Similarly, a portion of P-type region 215 which becomes a topmost layer is exposed, and a metal wiring is formed at the exposed region to form anode A. Simultaneously, gate G is formed at P-type region 212.

FIG. 6D is an equivalent circuit diagram of light emitting thyristor 210 drawn in comparison with FIGS. 6B and 6C. Light emitting thyristor 210 includes PNP transistor (hereinafter referred to as "PNPTR") 221 and NPN transistor (hereinafter referred to as "NPNTR") 222. An emitter of PNPTR 221 corresponds to anode A of light emitting thyristor 210, a base of NPNTR 222 corresponds to gate G of light emitting thyristor 210, and an emitter of NPNTR 222 corresponds to cathode K of light emitting thyristor 210. Further, a collector of PNPTR 221 is connected to the base of NPNTR 222, and a base of PNPTR 221 is connected to a collector of NPNTR 222.

Although light emitting thyristor 210 shown in FIG. 6 has an AlGaAs layer formed on a GaAs wafer substrate, the material is not limited thereto, and materials such as GaP, GaAsP or AlGaInP may be used alternatively. Moreover, the layer may be formed on a sapphire substrate using such materials as GaN, AlGaN and InGaN.

Light emitting thyristor 210 shown in FIG. 6 is bonded to an IC wafer on which shift register 110 is formed, by, for example, an epitaxial film bonding technique, and connection terminals therebetween are wired using a photolithography technique. Further, light emitting thyristor 210 is separated to a plurality of chips using a known dicing technique to form a composite chip including IC chip 100 and light emitting element array 200 as shown in FIG. 4.

(NMOS Shown in FIG. 1)

Figure 7A:
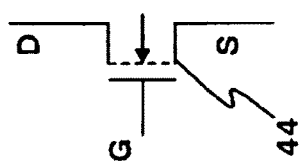
FIGS. 7A to 7C are diagrams illustrating a configuration of NMOS 44 in FIG. 1.
Figure 7B:
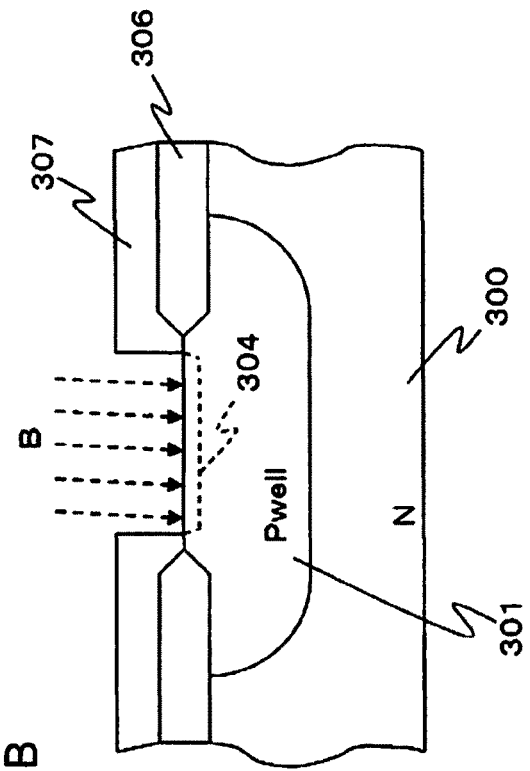
Figure 7C:
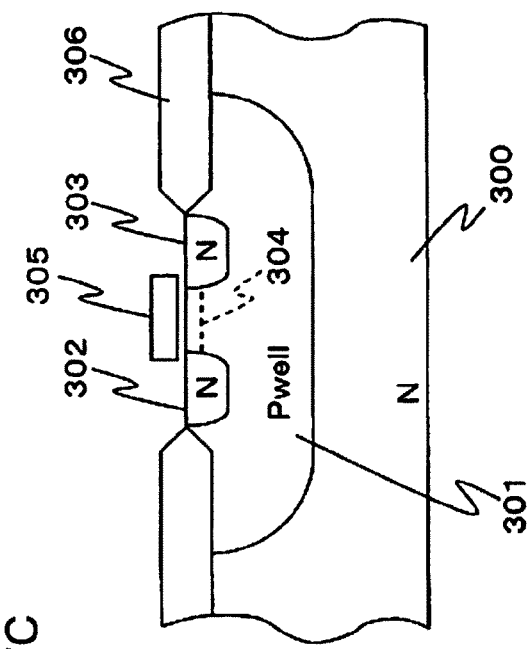

FIGS. 7A to 7C are configuration diagrams illustrating NMOS 44 shown in FIG. 1.

FIG. 7A shows circuit symbols of NMOS 44 having three terminals including drain D, gate G, and source S. FIG. 7B is a vertical cross section view illustrating a step in process of manufacturing NMOS 44, taken along the channel direction. FIG. 7C is a vertical cross sectional view of NMOS 44 taken along the channel direction.

As shown in FIG. 7C, NMOS 44 is formed on substrate 300 made of, for example, a N-type silicon wafer, together with PMOS 43 shown in FIG. 1. In the surface of substrate 300, PMOS 43 (not shown) is formed, and substrate region (for example, an P well region (P-well)) 301 for forming NMOS is formed in substrate 300 to electrically separate NMOS 44 with respect to PMOS 43. P well region 301 is formed by diffusing a P-type impurity in the form of islands in substrate 300. In P well region 301, source region 302 and drain region 303 are formed opposed to each other by diffusing a N-type impurity.

Gate portion 305 made of polysilicon is formed on channel formation region 304, which is a region whereupon a channel is to be formed, between source region 302 and drain region 303, via a gate insulating film (not shown). Source region 302 and drain region 303 are formed by diffusing a N-type impurity in substrate 300 with gate portion 305 as a mask. NMOS 44 includes source region 302, drain region 303 and gate section 305, and field oxide film 306 is formed around source region 302 and drain region 303 so as to electrically separate NMOS 44 from other elements (not shown).

Metal electrodes (not shown) are formed on contact regions on source region 302, drain region 303 and gate portion 305, and source S is connected to source region 302, drain D to drain region 303, and gate G to gate portion 305 respectively. All of such regions are covered with a passivation film (not shown).

FIG. 7B illustrates an impurity injection step wherein an impurity is injected into channel formation region 304 before formation of gate region 305. In the impurity injecting step, areas in which circuits (for example, NMOS or the like) other than channel formation region 304 of NMOS 44 are to be formed are covered by resist film 307, with channel formation region 304 being exposed. Into exposed channel formation region 304, impurity (for example, boron B as P-type impurity) having the same polarity as that of P-well region 301, being the substrate region, is injected, as shown by dashed arrows in FIG. 7B. After the impurity injection step, as shown in FIG. 7C, formation of gate region 305, and formation of source region 302 and drain region 303 with gate region 305 as a mask are executed.

The above described impurity injection step of Embodiment 1 is performed for the following reason.

In general, regarding NMOS 44, N-type impurity such as phosphorus P or the like is injected into a shallow part of channel formation region 304, to ease the formation of a channel as an inversion layer, and to reduce the threshold voltage, so that required transistor characteristics are obtained. In contrast, Embodiment 1 injects P-type impurity such as boron B or the like to a shallow part of channel formation region 304, to make the formation of a channel as an inversion layer difficult, to instead increase the threshold voltage, and to adjust the transistor characteristics described later.

(Schematic Operation of Printing Controller and Print Head According to Embodiment 1)

In FIG. 1, for example, when ON/OFF command signal DRVON-P in printing controller 40 is at a low level (hereinafter, referred to as "L level"), PMOS 43 constituting CMOS inverter 42 is turned on, NMOS 44 is turned off, and data terminal DA on the output side turns to a high level (hereinafter, referred to as "H level") supply voltage VDD). Consequently, voltage of common terminal IN on the side of print head 13 becomes substantially supply voltage VDD, anode-to-cathode voltage of light emitting thyristors 210 become substantially zero, drive current Iout flowing to an anode of light emitting thyristors 210 becomes zero, and thus all of light emitting thyristors 210-1 to 210-n are in a non-light emitting state.

On the contrary, when ON/OFF command signal DRVON-P is at H level, PMOS 43 constituting CMOS inverter 42 is turned off, NMOS 44 is turned on, and data terminal DA on output side turns to L level (=0V). Consequently, voltage of common terminal IN on the side of print head 13 becomes zero, supply voltage VDD is applied to the anode of light emitting thyristors 210, the voltage of the cathode become L level (=0V), and thus supply voltage VDD is applied between the anode and the cathode of light emitting thyristors 210. At the time, H level is applied to only gates of light emitting thyristors having a light emission command from shift register 110 out of light emitting thyristors 210-1 to 210-n, and thus the trigger current flows through gates of such light emitting thyristors and such light emitting thyristors are selectively turned on.

The current flowing through the cathode of the turned-on light emitting thyristors is a current flowing into data terminal DA (that is, drive current Iout), putting turned-on light emitting thyristors in the light emitting state to emit light having light-emission output according to the value of drive current Iout.

As described later, an operation condition is set such that NMOS 44 operates in a saturation region. In the case where NMOS 44 operates in the saturation region, drain current Id is given by the following formula, as well known from a theory of electronic device physics.

$$Id = K*(W/L)*(Vgs-Vtn)^2$$

Where;
K: Constant
W: Gate width of NMOS 44
L: Gate length of NMOS 44
Vtn: Threshold voltage of NMOS 44
Vgs: Gate-to-source voltage of NMOS 44 (≈supply voltage VDD)

As apparent from the above formula, drain current Id of NMOS 44, that is, drive current Tout of light emitting thyristor 210 can be varied by adjusting potential of threshold voltage Vtn.

Moreover, in MOS transistors operating in a saturation region, like NMOS 44, drain current can be kept at a predetermined value by setting the element size thereof appropriately even when there is a slight variation of the drain potential. Such characteristic is known as a constant current characteristic of the MOS transistor, and preferably, gate length L of NMOS 44 is set to have a larger value in order to obtain a good characteristic.

Further, in drive circuit 41 shown in FIG. 1, PMOS 43 is provided to turn data terminal DA to H level. However, in a case where there is no need of high speed switching of light emitting thyristor 210, PMOS 43 may be omitted since light emitting thyristors 210-1 to 210-n can be turned off by shutting off drive current Iout with NMOS 44 turned off.

(Detailed Operations of Printing Controller and Print Head According to Embodiment 1)

Figure 8:
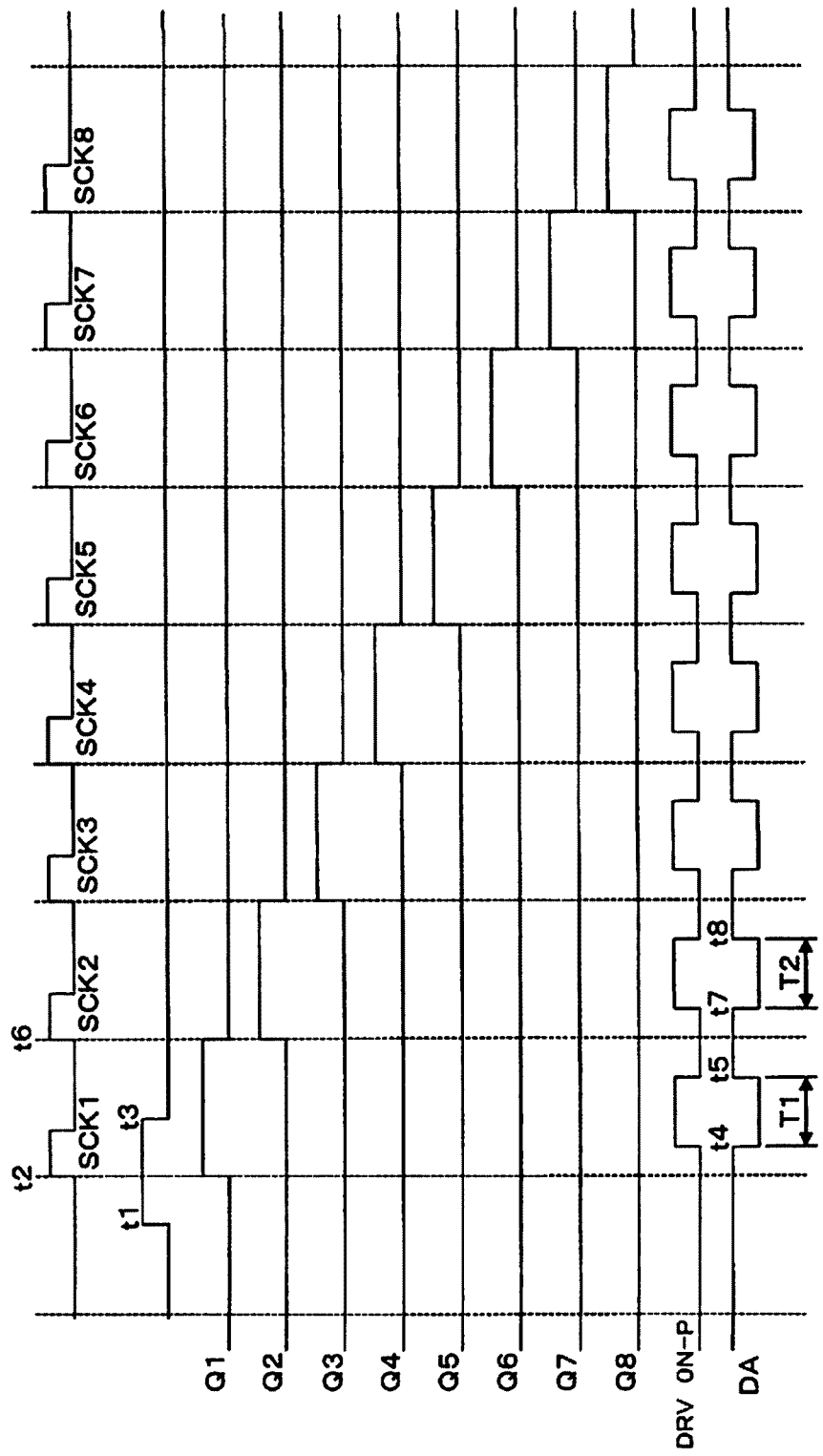
FIG. 8 is a time chart illustrating operations of the circuit configuration shown in FIG. 1.

FIG. 8 is a time chart illustrating detailed operations of print head 13 and printing controller 40 shown in FIG. 1.

FIG. 8 shows operation waveforms when light emitting thyristors 210-1 to 210-n (for example, n=8) shown in FIG. 1 are lit sequentially in one line scanning during printing operations of image forming apparatus 1 shown in FIG. 2.

First, as a preliminary operation when image forming apparatus 1 is powered on, shift register 110 shown in FIG. 1 is reset. In this reset operation, serial data SI is kept at L level, and clock pulse of serial clock SCK of the number corresponding to the number of stages of shift register 110 (for example, n=8) is input to shift register 110, whereby all output terminals thereof Q1 to Q8 of shift register 100 turn to L level.

Prior to one line scanning, serial data SI is set to H level at time t1 shown in FIG. 8. Then, first pulse SCK1 of serial clock SCK is input at time t2. When first pulse SCK1 rises, serial data SI is loaded into first-stage FF111-1 in shift register 110, and with a slight delay behind thereof, output terminal Q1 of first-stage FF111-1 shifts to H level. After first pulse SCK1 rises, serial data SI is turned to L level again at time t3.

When output terminal Q1 of first-stage FF111-1 is turned to H level, gate potential of light emitting thyristor 210-1 rises. Then, ON/OFF command signal DRVON-P is turned to H level at time t4, whereby NMOS 44 of CMOS inverter 42 is turned on to turn data terminal DA to L level, whereby a potential difference is caused between the gate and the cathode of light emitting thyristor 210-1. Consequently, the trigger current turns on light emitting thyristor 210-1 and puts light emitting thyristor 210-1 in a light emitting state.

The light emitting state of light emitting thyristor 210-1 is caused mainly by current flowing between the anode and the cathode. Therefore, to turn off light emitting thyristor 210-1 once turned on, voltage applied between the anode and the cathode must be dropped to zero. For this reason, ON/OFF command signal DRVON-P is turned to L level at time t5. Then, PMOS 43 of CMOS 42 is turned on to turn data terminal DA to H level, whereby voltage between the anode and the cathode of light emitting thyristor 210-1 drops down to substantially 0V and light emitting thyristor 210-1 is turned off.

As described above, light-emission output of light emitting thyristors 210-1 to 210-n is generated mainly by the current value of drive current Tout flowing between the anode and the cathode thereof. Therefore, drive current Iout of light emitting thyristor 210 can be kept at a predetermined value using drive circuit 41 having the constant current characteristic as a drive source in FIG. 1, even when a slight element variation occurs in the anode-to-cathode voltage when light emitting thyristor 210 emits light.

In FIG. 8, data terminal DA is turned to L level at time t4 to cause light emitting thyristors 210-1 to emit light, and turned to H level at time t5 to turn off the light emitting thyristors. If there is no need to have light emitting thyristor 210-1 emit light, data terminal DA may be held at H level between t4 and t5. In this way, light-emitting state and non-light-emitting state of light emitting thyristor 210-1 can be switched by the logic level of data terminal DA.

Then, second pulse SCK2 of serial clock SCK rises at time t6. Since serial data SI is at L level at that time, output terminal Q1 of first-stage FF111-1 in shift register 110 shifts to L level with a slight delay therefrom, while output terminal Q2 of second-stage FF111-2 changes to H level. At time t7, ON/OFF command signal DRVON-P is turned to H level, whereby NMOS 44 of CMOS 42 is turned on and data terminal DA is turned to L level. Consequently, a potential difference occurs between the gate and the cathode of light emitting thyristor 210-2. With this, trigger current turns on light emitting thyristor 210-2 to the light-emitting state.

Since the light-emitting state of light emitting thyristor 210-2 is generated mainly by the current value of drive current Iout flowing between the anode and the cathode, voltage applied between the anode and the cathode must be dropped to substantially 0V to turn off light emitting thyristor 210-2 once turned on. For this reason, ON/OFF command signal DRVON-P is turned to L level at time t8, whereby PMOS 43 of CMOS inverter 42 is turned on and potential of data terminal DA turns to H level, whereby voltage between the anode and the cathode of light emitting thyristor 210-2 drops to substantially 0V and light emitting thyristor 210-2 is turned off.

Thus, whenever first pulse SCK1, second pulse SCK2, third pulse SCK3, fourth pulse SCK4, fifth pulse SCK5, sixth pulse SCK6, seventh pulse SCK7, or eighth pulse SCK8 of serial clock SCK rises, only one output terminal Q out of first output terminal Q1, second output terminal Q2, third output terminal Q3, fourth output terminal Q4, fifth output terminal Q5, sixth output terminal Q6, seventh output terminal Q7 or eighth output terminal Q8 is turned to H level sequentially with other output terminals Q turned to L level. For this reason, when serial data SI is at L level, only a light emitting thyristor connected to a corresponding output terminal at H level selectively emit light, out of light emitting thyristors 210-1 to 210-n connected to output terminals Q1 to Qn.

At that time, light emitting thyristors 210-1 to 210-n can be turned on by only providing a potential difference biasing to the PN junction between the gate and the cathode of light emitting thyristors 210-1 to 210-n in the forward direction to give the gate current. Also, light emitting thyristors 210-1 to 210-n can be held off by only keeping the potential difference between the gate and the cathode below the forward voltage, and thus the potential difference may be set to 0V or voltage may be applied in the reverse direction.

Further, drive time T1 between times t4 and t5 at light emitting thyristor 210-1, drive time T2 between times t7 and t8 at light emitting thyristor 210-2, and the like shown in FIG. 8 may be different. Even if any variation in the light emitting efficiency of light emitting thyristors 210-1 to 210-n occur, it is easy to control drive times T1, T2 and the like to different values in order to obtain a predetermined exposure energy by correcting the variation.

(Operation of Light Emitting Thyristor According to Embodiment 1)

Figure 9A:
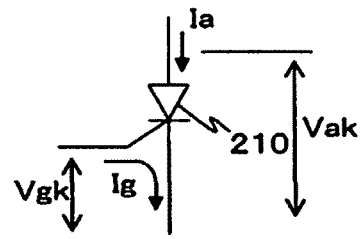
FIGS. 9A to 9D are diagrams illustrating operations of the turn-on step in light emitting thyristor 210 shown in FIG. 6.
Figure 9B:
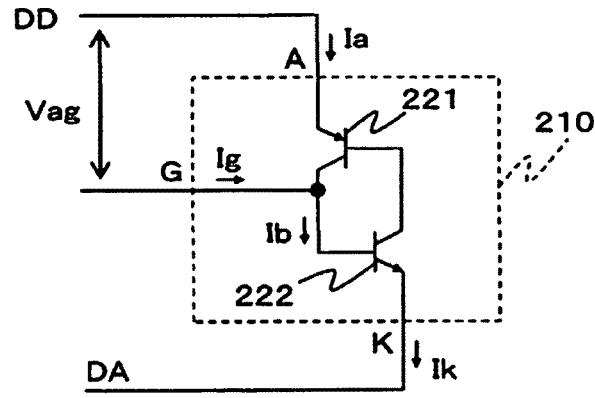
Figure 9C:
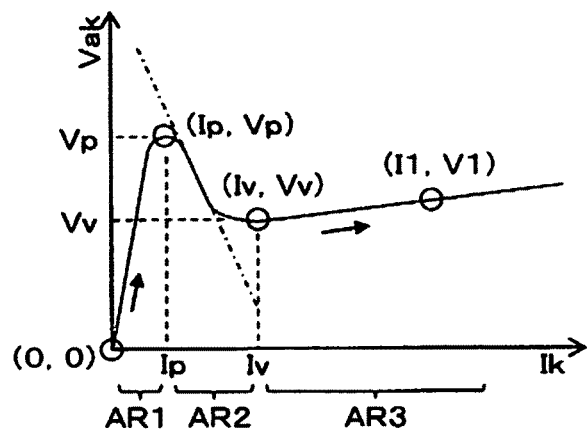
Figure 9D:
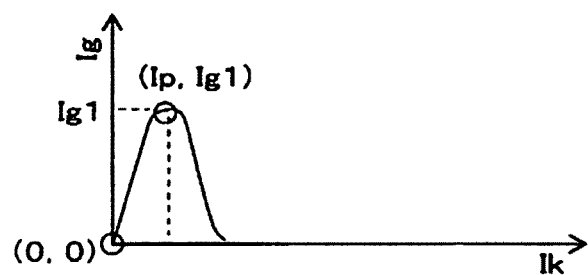

FIGS. 9A to 9D are diagrams illustrating operations of turn-on steps in light emitting thyristor 210 shown in FIG. 6. FIG. 9A is a diagram illustrating symbols of light emitting thyristor 210 and signs of voltage and current of terminals, FIG. 9B is a diagram illustrating an equivalent circuit of FIG. 9A, and FIGS. 9C and 9D are diagrams illustrating operation waveforms.

In light emitting thyristor 210 shown in FIG. 9A, Vak, Vgk, Ia and Ig represent the anode-to-cathode voltage, the gate-to-cathode voltage, the anode current, and the gate current respectively.

In FIG. 9B, an equivalent circuit of light emitting thyristor 210 encircled by the broken line includes PNPTR 221 and NPNTR 222.

For example, the turn-on process of light emitting thyristor 210 is described assuming that the gate G is at H level.

To drive light emitting thyristor 210, output voltage of a drive circuit (not shown) is turned to L level. Since the gate is at H level at that time, gate current Ig is generated. Then, gate current Ig flows through the PN junction between the gate and the cathode of light emitting thyristor 210, that is, between the emitter and the base of NPNTR 222 in the forward direction.

Gate current Ig corresponds to base current Ib of NPNTR 222 in light emitting thyristor 210. The flow of base current Ib initiates shift of NPNTR 222 to the ON state, thereby generating collector current Ik in a collector of NPNTR 222. Note that "Ik" illustrated in the Figure represents the emitter current, which is substantially the same as the corrector current of the NPNTR 222. The collector current Ik becomes a base current of PNPTR 221, which shifts PNPTR 221 to the ON state. The collector current generated thereby increases the base current Ib of NPNTR 222 and thereby accelerates shift of NPNTR 222 to the ON state.

On the other hand, after PNPTR 221 shifts to the ON state completely, the collector-to-emitter voltage thereof, that is, anode-to-gate voltage Vag, drops, whereby the gate potential rises. When it becomes above H level output voltage (VoH) of the gate drive circuit (not shown), gate current Ig flowing to the gate of light emitting thyristor 210 from an output terminal of the gate drive circuit becomes substantially zero. Consequently, cathode current Ik substantially equal to anode current Ia flows into the cathode K of light emitting thyristor 210, whereby light emitting thyristor 210 is turned to the ON state completely.

FIG. 9C is a diagram illustrating a turn-on step of light emitting thyristor 210, in which the abscissa indicates cathode current Ik and the ordinate indicates anode-to-cathode voltage Vak.

When light emitting thyristor 210 is turned out, cathode current Ik is substantially zero, which corresponds to the origin (0,0) of a graph shown in FIG. 9C. When the cathode is driven as light emitting thyristor 210 initiates the turn-on, the cathode potential drops, whereby anode-to-cathode voltage Vak rises and reaches anode voltage Vp at the peak point thereof as shown by an arrow in FIG. 9C.

When anode voltage Vp at the peak point is applied, gate current Ig (base current Ib of NPNTR 222) is generated. In FIG. 9C, an encircled point (Ip, Vp) corresponds to a boundary between OFF region AR1 and ON shift region AR2 of light emitting thyristor 210.

As cathode current Ik further increases from cathode current Ip at the peak point, a point represented by (Ip, Vp), anode-to-cathode voltage Vak drops down to an encircled point (Iv, Vv) which corresponds to a boundary between ON shift region AR2 and ON region AR3 of light emitting thyristor 210. Current Ig at point (Iv, Vv) drops down to substantially zero, and the gate drive circuit (not shown) is substantially in a state equivalent to that the gate drive circuit is separated from gate G of light emitting thyristor 210.

As cathode current Ik further increases from point (Iv, Vv), anode-to-cathode voltage Vak of light emitting thyristor 210 increases again up to encircled point (I1, V1) which represents a final operating point of light emitting drive of light emitting thyristor 210, in which light emitting drive with a predetermined light emitting power is performed by cathode current Ik (=I1) equal to drive current Iout supplied from drive circuit 41 shown in FIG. 1.

FIG. 9D is a diagram corresponding to FIG. 9C, in which the abscissa indicates cathode current Ik and the ordinate indicates gate current Ig. FIG. 9D shows a relation between gate current Ig generated at the turn-on step of light emitting thyristor 210 described above and the peak value Ig1 thereof and anode voltage Vp and cathode current Ip described above.

ON shift region AR2 shown in FIG. 9C is characterized in that anode-to-cathode voltage Vak drops as cathode current Ik increases, and negative resistance is exhibited between the anode and the cathode in ON shift region AR2. Shown by single dotted line in FIG. 9C is a tangential line of a characteristic line in the negative resistance region mentioned above, with the slope thereof corresponding to the negative resistance value. The negative resistance value fluctuates depending on fabrication variation, chip temperature, or the like of light emitting thyristor 210, and typically reaches thousands of ohm.

On the contrary, a conventional drive circuit (corresponding to drive circuit 41 shown in FIG. 1) includes a CMOS inverter (corresponding to CMOS inverter 42 shown in FIG. 1) including PMOS and NMOS, and a current limiting resistor connected between an output side of the CMOS inverter and an cathode (corresponding to an cathode of the light emitting thyristor shown in FIG. 1) of the light emitting thyristor. A typical resistance value of the current limiting resistor is set, for example, to 200 ohm. Therefore, to drive light emitting thyristor 210 having characteristics shown in FIG. 9 using the conventional drive circuit, the turn-on step thereof shifts from the origin (0, 0) of a graph shown in FIG. 9C to point (Iv, Vv) via point (Ip, Vp) as shown by an arrow in FIG. 9C, and light emitting drive takes place finally at point (IL V1). Since, the ON shift step passes via a negative resistance region shown by ON shift region AR2, there is a problem that output of the resistance value (substantially equal to a resistance value of the current limiting resistor mentioned above) oscillates in the ON shift region AR2 since the output resistance is lower than a negative resistance value of light emitting thyristor 210.

In order to solve such problems, drive circuit 41 according to Embodiment 1 includes NMOS 44 in CMOS inverter 42 configured as shown in FIG. 7 by omitting the conventional current limiting resistor. Hereinafter, transistor characteristics of NMOS 44 according to Embodiment 1 are described.

(Transistor Characteristics of NMOS According to Embodiment 1)

Figure 10A:
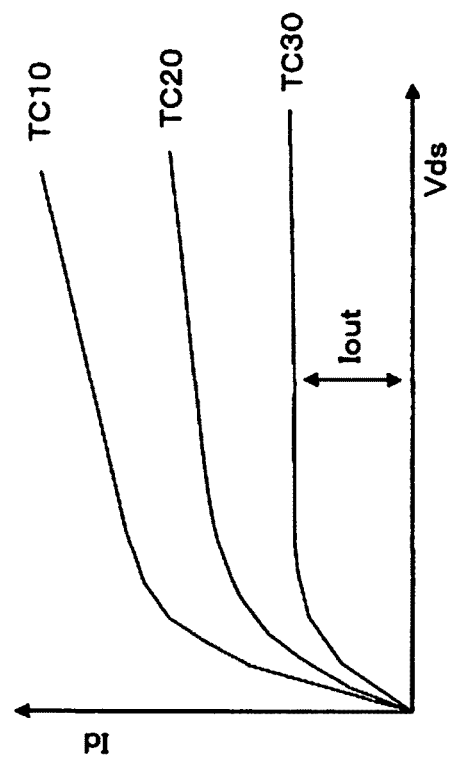
FIGS. 10A and 10B are diagrams illustrating transistor characteristics of NMOS 44 shown in FIG. 7.
Figure 10B:
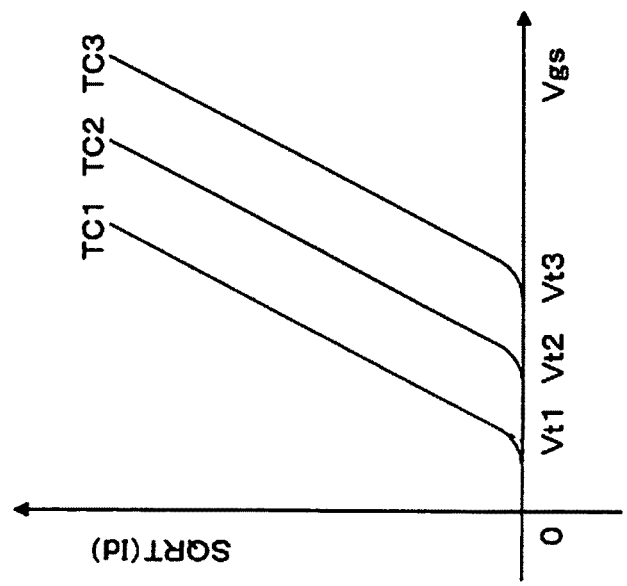

FIGS. 10A and 10B are diagrams illustrating transistor characteristics of NMOS 44 shown in FIG. 7.

FIG. 10A is a diagram illustrating a relation between the gate voltage and the drain current of NMOS 44, in which the abscissa indicates gate-to-source voltage Vgs, and the ordinate indicates a square root of the drain current as SQRT (Id).

In FIG. 10A, for example, curve TC1 varies substantially in a linear fashion as gate-to-source voltage Vgs increases, and a point where the tangential line and the abscissa in curve TC1 intersects each other represents threshold voltage Vt1 of NMOS 44. Note that curve TC1 indicates a state where the amount of the P type impurity injected into channel formation region 304 is small in FIG. 7B.

On the contrary, as the amount of the P type impurity injected into channel formation region 304 increases, threshold voltage Vt1 shifts in a direction in which it increases, as shown by curve TC2 in FIG. 10A (threshold voltage at that time is Vt2). As the amount of the P type impurity injected into channel formation region 304 is further increased, the characteristic shown by curve TC3 having threshold voltage Vt3 is obtained.

FIG. 10B is a diagram schematically illustrating a relation between the drain voltage and the drain current when the gate-to-source voltage is made substantially equal to supply voltage VDD in NMOS 44, in which the abscissa and the ordinate indicate drain-to-source voltage Vds and drain current Id respectively.

In FIG. 10B, Curve TC10, Curve TC20 and Curve TC30 correspond to Curves TC1, TC2 and TC3 in FIG. 10A respectively. For example, Curve TC10 is characterized in that a large value of drain current Id can be obtained, while drain current Id also increases as drain-to-source voltage Vds increases. Curve TC20 is characterized in that the value of drain current Id becomes lower than that shown in Curve TC10. Curve TC30 is characterized in that a value of drain current Id becomes lower than that shown in Curve TC20, but if drain-to-source voltage Vds is higher than a predetermined value, drain current ID can be regarded substantially constant as drive current Iout, and constant current characteristics not dependent on drain-to-source voltage Vds are obtainable.

To describe the above relation quantitatively, drain current Id of NMOS 44 can be obtained from the following formula as well known from a theory of electronic device physics:

$$Id = K \times (W/L) \times (Vgs - Vtn)^2$$

where;
K: Constant
W: Gate width of NMOS 44
L: Gate length of NMOS 44
Vgs: Gate-to-source voltage of NMOS 44
Vtn: Threshold voltage of NMOS 44

As described using FIG. 1 and FIG. 7, in drive circuit 41 according to Embodiment 1, threshold voltage Vtn of NMOS 44 is increased by appropriately adjusting the amount of P-type impurity injected in channel formation region 304.

At that time, H level voltage applied between the gate and the source of NMOS 44 is at most 3.3V, substantially equal to supply voltage VDD. Consequently, as threshold voltage Vtn increases, overdrive voltage AV (=Vgs−Vtn) decreases and thus NMOS 44 operates in the saturation region.

It is easy to set power supply voltage VDD to a value less than 3.3 V, for example, 3.0V, 2.7V, or the like, and this makes it easier to operate NMOS 44 in the saturation region.

Furthermore, the ratio between gate width W and gate length L of NMOS 44 can be changed relatively freely and in a wide range at the design stage of NMOS 44. Moreover, threshold voltage Vtn can be adjusted as described above, and drain current Id also can be adjusted relatively freely.

Further, in NMOS 44, even when there is a slight fluctuation in the drain voltage, a drain current value can be maintained at a predetermined value by setting gate length L to a relatively higher value. Such characteristics are known as constant current characteristics of MOS transistors, and gate length L is preferably set to a relatively higher value so as to obtain good characteristics.

When NMOS 44 operates at constant current, the output resistance value thereof becomes extremely high (ideally, infinite), whereby a load line drawn in a characteristic curve of light emitting thyristor 210 shown in FIG. 9C becomes a substantially vertical line, which intersects the characteristics line of light emitting thyristor 210 at a single point.

With a configuration as described above, drive circuit 41 according to Embodiment 1 solves the conventional problem of oscillation of light emitting thyristor 210 caused by the negative resistance.

(Advantageous Effects According to Embodiment 1)

According to Embodiment 1, effects (1) to (3) described below are provided.

(1) According to the drive device including drive circuit 41 according to Embodiment 1 and print head 13 driven thereby, the impurity of the same polarity as that of the substrate region is injected in NMOS 44 in drive circuit 41 to increase threshold voltage Vtn so as to achieve constant current driving by NMOS 44 operating in the saturation region. Therefore, the output resistance value of drive circuit 41 can be higher than the negative resistance value of light emitting thyristor 210, whereby oscillation resulting from the negative resistance is prevented.

(2) The configuration of drive circuit 41 of Embodiment 1 does not require a current limiting resistor, which is provided in the conventional drive circuit, between date terminal DA and the output terminal of the CMOS inverter (corresponding to CMOS inverter 42 in Embodiment 1). Thus, printed substrate 13b of the substrate unit shown in FIG. 4 used in print head 13 shown in FIG. 3 does not need a space for the current limiting resistor which is provided in the conventional art and a space for wires to connect the output terminal of CMOS inverter 42 and the current limiting resistor which is provided in the conventional art. That is, printed substrate 13b used in print head 13 can be downsized.

(3) According to image forming apparatus 1 according to Embodiment 1, print head 13 adopted thereto provides high quality image forming apparatus 1 having good space efficiency and light extraction efficiency. That is, by using print head 13, such effects can be obtained in not only full-color image forming apparatus 1 but also monochrome and multiple color image forming apparatuses. In particular, more significant effects are obtained in full-color image forming apparatus 1 which needs plural print heads 13 as the exposure devices.

Embodiment 2

(Printing Controller and Print Head According to Embodiment 2)

Figure 11:
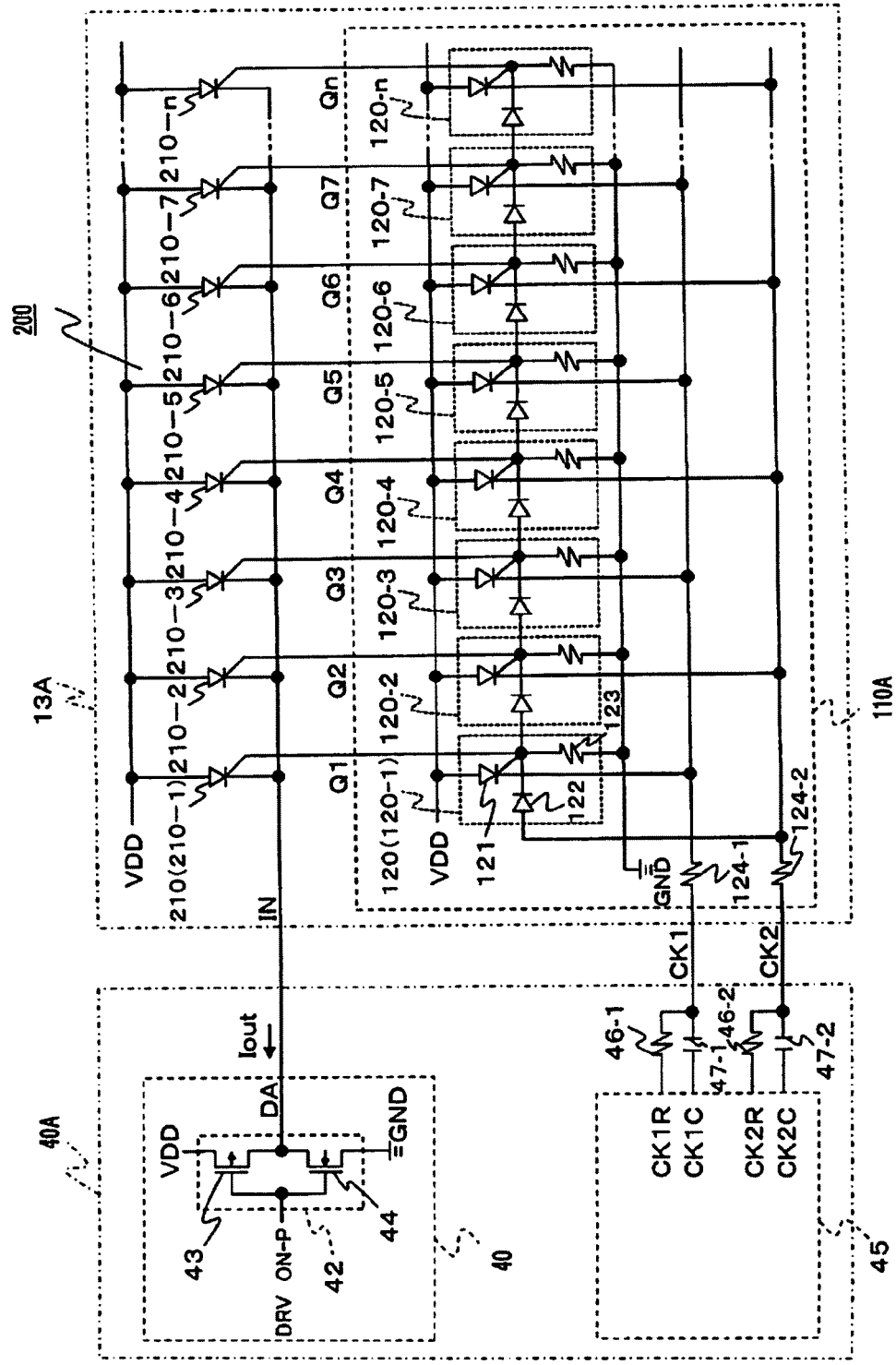
FIG. 11 is a plotter diagram illustrating a circuit configuration of a printing controller and a print head according to Embodiment 2 of the invention.

FIG. 11 is a block diagram illustrating a schematic circuit configuration of a printing controller and a print head according to Embodiment 2 of the invention, in which common signs are assigned to elements common to those of Embodiment 1 shown in FIG. 1.

In image forming apparatus 1 according to Embodiment 2, the circuit configuration of printing controller 40A and print head 13A are different from that of printing controller 40 and print head 13 according to Embodiment 1.

Print head 13A according to Embodiment 2 includes shift register 110A of the self scanning type whose configuration is different from shift register 110 of Embodiment 1 and light emitting element array 200 and the like which are the same as those of Embodiment 1.

Self scanning type shift register 110A is a circuit to supply trigger current to light-emitting element array 200 to turn light-emitting element array 200 on and off, which includes multi-stages of circuits 120 (120-1 to 120-n) with self scanning thyristors. Each of circuits 120 (=120-1 to 120-n, for example, n=4992) includes: self scanning thyristor 121 whose anode is connected to VDD power supply; diode 122 whose cathode is connected to a gate of self scanning thyristor 121; resistor 123 connected between ground GND and the gate of self scanning thyristor 121. In self scanning thyristor 121 at each odd stage of circuits 120-1, 120-3, . . . , and 120-(n−1), its anode is connected to VDD power supply, its cathode is connected to an end of resistor 124-1, its gate is connected to ground GND via resistor 123 and also connected to an end of resistor 124-2 via an anode and an cathode of diode 122. In self scanning thyristor 121 at each even stage of circuits 120-2, 120-4, . . . , and 120-n, its anode is connected to VDD power supply, its cathode is connected to an end of resistor 124-2, its gate is connected to ground GND via resistor 123 and also connected to an end of resistor 124-1 via the cathode and the anode of diode 122. The gate of self scanning thyristor 121 of each stage is connected to corresponding one of output terminal Q1 to Qn of self scanning type shift register 110A.

Self scanning thyristor 121 of each stage of circuits 120-1 to 120-n is a circuit element that has the same layer structure and operates the same circuit operation as those of light emitting thyristor 210 of light emitting element array 200, but is used with the top layer covered by a metal film or the like, since self scanning thyristor 121 in this embodiment does not need the luminous function like light emitting thyristor 210. Diode 122 whose cathode is connected to the gate of self scanning thyristor 121 of each stage is provided to connect the gates of self scanning thyristors 121 to one another and determines the scanning direction (for example, rightward in FIG. 11) when light emitting thyristors 210-1 to 210-n are sequentially turned on. Printing controller 40A includes: a plurality of drive circuits 41, which are the same as those of Embodiment 1, to drive a plurality of light emitting element arrays 200 in a time divided manner; clock drive circuit 45 to provide a clock signal (hereinafter, referred to as "clock") to self scanning type shift register 110A; an unillustrated power supply terminal; an unillustrated ground terminal; and the like. In FIG. 11, as in FIG. 1, only one drive circuit 41 is shown in order to simplify the description. The plurality of light emitting element arrays 200 include, for example, a total of 4992 light emitting thyristors 210-1 to 210-n, . . . and are configured such that a plurality of light emitting thyristor sets are grouped and divided drive of drive circuit 41 provided each per group is performed in parallel in real time.

A drive device according to Embodiment 2 includes drive circuits 41, clock drive circuit 45 and the like provided on the side of printing controller 40A and self scanning type shift register 110A provided on the side of print head 13A.

Citing a typical design as an example, 26 chips of light emitting element array 200 formed by arranging 192 light emitting thyristors 210 (210-1 to 210-n) are regularly positioned on printed substrate 13b shown in FIG. 4. This configuration includes a total of 4992 light emitting thyristors 210-1 to 210-n, . . . required for print head 13A. Drive circuit 41 is disposed in association with 26 light emitting element arrays 200 described above, and the total number of output terminals of drive circuits 41 is 26. In contrast, clock drive circuit 45 is shared by the chips of light emitting element array 200 since clock drive circuit 45 can drive the chips of light emitting element array 200 in parallel. Although FIG. 11 shows drive circuits 41 and clock drive circuit 45 disposed inside printing controller 40A, drive circuits 41 and clock drive circuit 45 may be disposed in print head 13A.

Clock drive circuit 45 includes plural output terminals CK1R, CK1C, CK2R, and CK2C for the clock output. Output terminals CK1R, CK1C, CK2R, and CK2C are connected to an unillustrated three-state buffer. The three-state buffer is a circuit having a CMOS output driver and allows its output to assume a high impedance (hereinafter, referred to as "Hi-Z") output state in addition to a H level output state and a L level output state.

Output terminals CK1R, CK1C, CK2R, and CK2C of clock drive circuit 45 are respectively connected to resistor 46-1, capacitor 47-1, resistor 46-2, and capacitor 47-2 at one end. The other end of resistor 46-1 and the other end of capacitor 47-1 are connected to clock terminal CK1, which is connected to the other end of resistor 124-1 on the side of print head 13A. The other end of resistor 46-2 and the other end of capacitor 47-2 are connected to clock terminal CK2, which is connected to the other end of resistor 124-2 on the side of print head 13A.

(Operations of Printing Controller and Print Head According to Embodiment 2)

In FIG. 11, for example, when ON/OFF command signal DRVON-P in printing controller 40A is at L level, PMOS 43 of CMOS inverter 42 is turned ON, NMOS 44 is turned OFF, data terminal DA, which is the output of CMOS inverter 42, is turned to H level (≈supply voltage VDD).

Consequently, voltage of common terminal IN on the side of print head 13A becomes substantially supply voltage VDD, anode-to-cathode voltage of each light emitting thyristor 210 becomes substantially zero, drive current Iout flowing thereto becomes zero, and all of light emitting thyristors 210-1 to 210-n are in the state in which no light is emitted.

Alternatively, when ON/OFF command signal DRVON-P is at H level, PMOS 43 constituting CMOS inverter 42 is turned OFF, NMOS 44 is turned on, and data terminal DA is turned to L level (=0 V). Consequently, Voltage of common terminal IN of print head 13A becomes zero, supply voltage VDD is applied to the anode of each light emitting thyristor 210, the cathode of each light emitting thyristor 210 becomes at L level (=0 V), and thus supply voltage VDD is applied between the anode and the cathode of each light emitting thyristor 210. At that time, only light emitting thyristors 210 instructed to emit light are turned on by selectively turning only gates of instructed light emitting thyristors 210 out of all light emitting thyristors 210-1 to 210-n to H level to cause the trigger current to flow through the gates of instructed light emitting thyristors 210.

Current flowing into cathode C of turned-on light emitting thyristor 210 is a current flowing into data terminal DA (that is, drive current Iout), turning light emitting thyristor 210 to a light emitting state, and thereby generates light output corresponding to the value of drive current Iout.

Although drive circuit 41 shown in FIG. 11 is provided with PMOS 43B to turn data terminal DA to H level, like Embodiment 1, light emitting thyristors 210-1 to 210-n can be turned off by shutting off drive current Iout with NMOS 44 turned off. Therefore, PMOS 43 may be omitted in the case where high speed switching of light emitting thyristor 210 is not required.

(Detailed Operations of Printing Controller and Print Head According to Embodiment 2)

Figure 12:
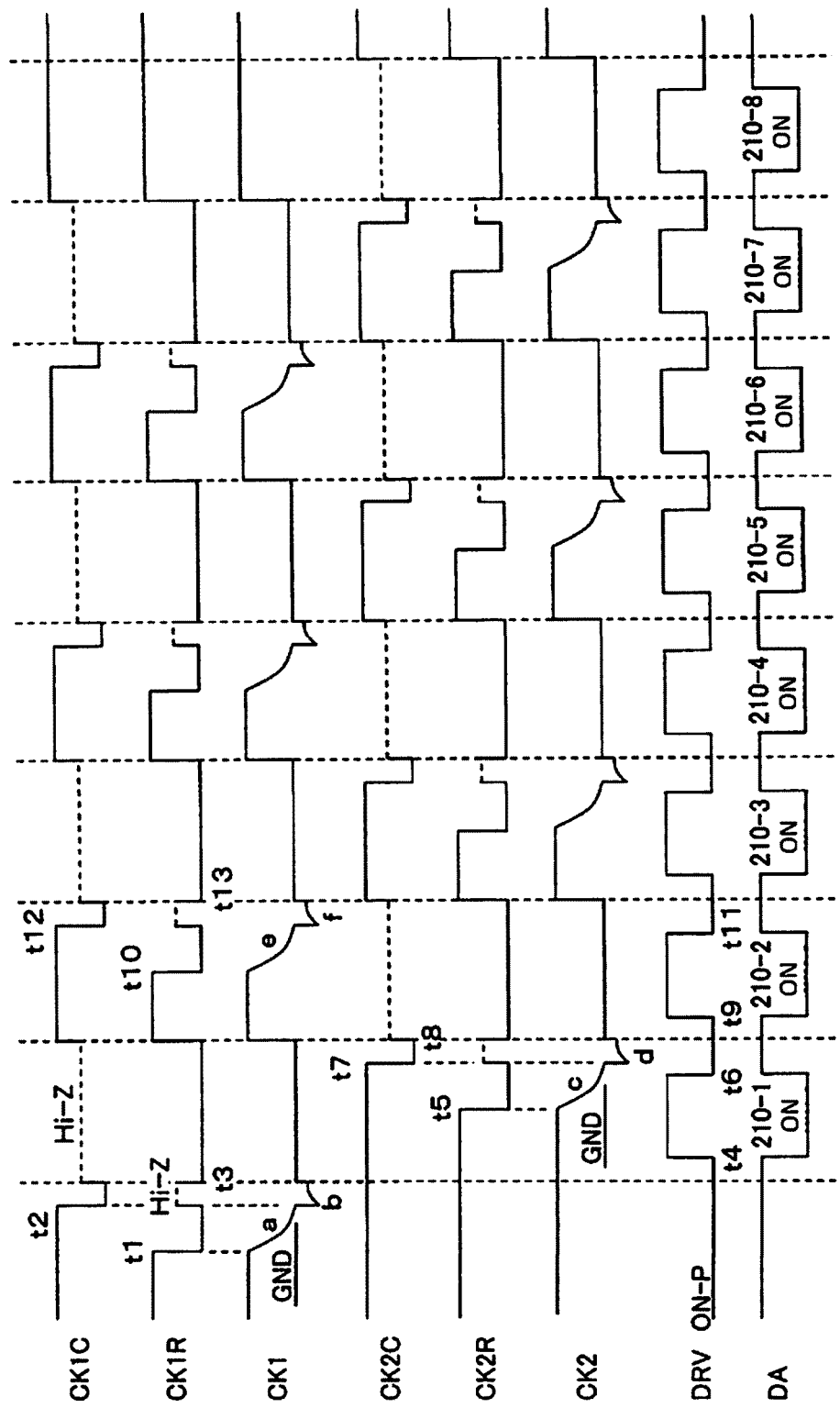
FIG. 12 is a time chart illustrating operations of the circuit configuration shown in FIG. 11.

FIG. 12 is a time chart illustrating detailed operations of print head 13A and printing controller 40A shown in FIG. 11.

FIG. 12 shows operation waveforms when light emitting thyristors 210-1 to 210-n (for example, n=8) shown in FIG. 11 are lit sequentially in one line scanning during printing operations of image forming apparatus 1 shown in FIG. 2, like Embodiment 1.

Like this Embodiment 2, self scanning type shift register 110A using self scanning thyristors 121 uses two-phase clock (dual clocks) supplied from two clock terminals CK1 and CK2. To generate the two-phase clock, two types of output terminals CK1C and CK1R and output terminals CK2C and CK2R are provided in clock drive circuit 45 for each clock. Output terminals CK1C and CK1R and output terminals CK2C and CK2R are driven by the unillustrated three-state buffer. The three-state buffer is the circuit having the CMOS output driver and functions to switch between H level output state and L level output state as well as Hi-Z output state.

At a state corresponding to the left end in the time chart in FIG. 12, signals of output terminals CK1C, CK1R, CK2C, and CK2R are all at H level.

Among output terminals CK1R, CK1C, CK2R, and CK2C of clock drive circuit 45, output terminals CK1R and CK1C are connected to clock terminal CK1 via resistor 46-1 and capacitor 47-1, respectively, whereas output terminals CK2R and CK2C are connected to clock terminal CK2 via resistor 46-2 and capacitor 47-2, respectively. Thus, at the state corresponding to the left end in the timechart of FIG. 12, signals of clock terminals CK1 and CK2 are both at H level. Accordingly, self scanning thyristors 121 of first, third, fifth, and seventh stage circuits 120-1, 120-3, 120-5, and 120-7 and self scanning thyristors 121 of the second, fourth, sixth, and eighth stage circuits 120-2, 120-4, 120-6, and 120-8 are at OFF state with their cathode being at H level.

Turn-on process (1) of self scanning thyristor 121 of first stage circuit 120-1, turn-on process (2) of self scanning thyristor 121 of second stage circuit 120-2, and turn-on process (3) of self scanning thyristor 121 of third stage circuit 120-3 are described below.

(1): Turn-on process of self scanning thyristor 121 in first stage circuit 120-1

At time t1 in FIG. 12, output terminal CK1R of clock drive circuit 45 is turned to L level. With this, a charging current flows through capacitor 47-1 in a direction from output terminal CK1C toward capacitor 47-1, resistor 46-1, and output terminal CK1R, while raising voltage between both ends of capacitor 47-1. Accordingly, the potential of clock terminal CK1 drops to ground (GND) potential at section "a" shown in FIG. 12.

At time t2, output terminal CK1C is turned to L level and output terminal CK1R is turned to Hi-Z state being the half voltage indicated by the horizontal broken line in FIG. 12. Since output terminal CK1R is shifted to the Hi-Z state at time 2, undershoot waveform occurs in clock terminal CK1 as shown by point "b" in FIG. 12. This undershoot waveform is caused by the charging voltage of capacitor 47-1.

In clock drive circuit 45 in FIG. 11, a parasitic diode exists in the unillustrated three-state buffer. Due to the occurrence of the undershoot waveform, a current flows through the parasitic diode, clamping the negative voltage level at point "b". As a result, the local minimum point of the undershoot waveform shown by point "b" remains a negative voltage of approximately –0.6 V at most. After that, the charge of capacitor 47-1 is self-discharged, as the voltage between both ends of capacitor 47-1 decrease. Therefore, the undershoot at point "b" disappears with time.

Due to the undershoot occurring at point "b" in clock terminal CK1, a relatively high voltage is applied between the anode and the cathode of thyristor 121 of first stage circuit 120-1. At that time, clock terminal CK2 is at H level, and thus the trigger current flows to the gate of thyristor 121 via diode 122 of first stage circuit 120-1, turning thyristor 121 on. The turned-on state of thyristor 12 continues until the cathode potential waveform of clock terminal CK1 becomes H level.

Next, at time t3, output terminal CK1C is turned to Hi-Z state and clock terminal CK1 is turned to L level. With this, potential of clock terminal CK1 becomes substantially equal to ground (GND) potential.

On the other hand, at time t4, to instruct light emitting thyristor 210-1 to emit light, ON/OFF command signal DRVON-P is turned to H level, and data terminal DA on the output side of CMOS inverter 42 is shifted to L level. At that time, thyristor 121 of first stage circuit 120-1 is in the ON-state and the cathode-to-gate voltage is equivalent to forward voltage, whereby the gate potential of thyristor 121 becomes higher than the cathode potential.

Since the gate of light emitting thyristor 210-1 and the gate of thyristor 121 of first stage circuit 120-1 are connected to each other, trigger current flows through the gate of light emitting thyristor 210-1, whereby light emitting thyristor 210-1 is turned on. The turned-on state of light emitting thyristor 210-1 continues until time t6 when ON/OFF command signal DRVON-P is turned to L level and data terminal DA is shifted to H level.

(2): Turn-on process of self scanning thyristor 121 in second stage circuit 120-2

At time t5, output terminal CK2R is turned to L level. With this, a charging current flows to capacitor 47-2 in a direction from output terminal CK2C toward capacitor 47-2, resistor 46-2, and output terminal CK2R, while raising voltage between both ends of capacitor 47-2. Accordingly, potential of clock terminal CK2 drops to ground (GND) potential at section "c" shown in FIG. 12.

After that, at time t7, output terminal CK2C is turned to L level and output terminal CK2R is turned to Hi-Z state being half voltage indicated by the horizontal broken line in FIG. 12. With the shifting of such a state at time t7, undershoot occurs in clock terminal CK2 as indicated by point "b" in FIG. 12. This undershoot waveform is caused by the charging voltage of capacitor 47-2. In clock drive circuit 45 in FIG. 11, the parasitic diode exists in the unillustrated three-state buffer. Due to the occurrence of the undershoot waveform, a current flows through the parasitic diode, clamping the negative voltage level. As a result, the local minimum point in the undershoot waveform indicated by point "d" in FIG. 12 remains a negative voltage of approximately –0.6 V. After that, the charge of capacitor 47-2 is self-discharged, as the voltage between both ends of capacitor 47-2 drops. Therefore, the undershoot at point "D" disappear with time.

Due to the undershoot at point "d" in clock terminal CK2, a relatively high voltage is applied between the anode and the cathode of thyristor 121 of second stage circuit 120-2. At that time, clock terminal CK2 is at H level and thyristor 121 of first stage circuit 120-1 is still in the ON-state, and thus the gate potential is high. With this, a trigger current flows to the gate of thyristor 121 of second stage circuit 120-2 via diode 122 of second stage circuit 120-2, turning such thyristor 121 on. The turned-on state of thyristor 121 of second stage circuit 120-2 continues until the cathode potential waveform of clock terminal CK2 becomes H level.

Next, at time t8, output terminal CK2C is turned to Hi-Z state and output terminal CK2R is turned to L level. With this, the potential of clock terminal CK2 becomes substantially equal to ground (GND) potential. At the same time, at time t8, output terminals CK1C and Cl1R are both turned to H level, and this turns clock terminal CK1 to H level. As a result, thyristor 121 of first stage circuit 120-1 is turned off.

On the other hand, at time t9, to instruct light emitting thyristor 210-2 to emit light, ON/OFF command signal DRVON-P is turned to H level, turning NMOS44 on, and shifting data terminal DA to L level. At that time, thyristor 121 of second stage circuit 120-2 is in the On-state and the cathode-to-gate voltage is equivalent to forward voltage, whereby the gate potential is higher than the cathode potential. Since the gate of light emitting thyristor 210-2 and the gate of thyristor 121 of second stage circuit 120-2 are connected to each other, trigger current flows through the gate of light emitting thyristor 210-2, thereby turning light emitting thyristor 210-2 on. The turned-on state of light emitting thyristor 210-2 continues, until time t11 when ON/OFF command signal DRVON-P is turned to L level to turn PMOS 43 on and data terminal DA is shifted to H level.

(3): Turn-on process of self scanning thyristor 121 in third stage circuit 120-1

At time t10, output terminal CK1R is turned to L level, and thus charging current flows to capacitor 47-1 in a direction from output terminal CK1C to capacitor 47-1, resistor 46-1, and output terminal CK1R, raising the voltage between both ends of capacitor 47-1. Accordingly, potential of clock terminal CK1 drops as shown by section "e" in FIG. 12.

Next, at time t12, output terminal CK1C is turned to L level and output terminal CK1R is turned to Hi-Z state being the half voltage indicated by the horizontal broken line shown in FIG. 12. With the shifting to such a state at time t12, undershoot waveform occurs in clock terminal CK1 as shown by section "f" in FIG. 12. This undershoot waveform is caused by the charging voltage of capacitor 47-1.

In clock drive circuit 45 of FIG. 11, the parasitic diode exists the unillustrated three-state buffer. Due to the occurrence of the undershoot waveform, a current flows through the parasitic diode, thereby clamping the negative voltage level. As a result, the local minimum point in the undershoot waveform indicated by point "f" in FIG. 12 remains a negative voltage of approximately –0.6 V at most. After that, the charge of capacitor 47-1 is self-discharged, as the voltage between both ends of capacitor 47-1 drops. Therefore, the undershoot at point "F" disappear with time.

Due to the undershoot at point "f" in clock terminal CK1, a relatively high voltage is applied between the anode and the cathode of thyristor 121 of third stage circuit 120-3. At that time, clock terminal CK1 is at H level and thyristor 121 of second stage circuit 120-2 is still in the ON-state, and thus the gate potential is high. With this, a trigger current flows to the gate of thyristor 121 of third stage circuit 120-3 via diode 122 of third stage circuit 120-3, turning on such thyristor 121. The ON-state of thyristor 121 of third stage circuit 120-3 continues until the cathode potential waveform of clock terminal CK2 becomes H level.

Next, at time t13, output terminal CK1C is turned to Hi-Z state and output terminal CK1R is turned to L level. Accordingly, the potential of clock terminal CK1 becomes substantially equal to ground (GND) potential. At the same time, at time t13, output terminals CK2C and CK2R are both turned to H level, thereby turning clock terminal CK2 to H level. As a result, thyristor 121 of second stage circuit 120-2 is turned off.

As described above in detail with reference to FIG. 12, the clock supplied from clock terminal CK1 and the clock supplied from clock terminal CK2 have the same repeated waveform having different phases, and these two clocks are sequentially input to a set of thyristors 121 of first, third, fifth, seventh-stage circuits 120-1, 120-3, 120-5, 120-7 and a set of thyristors 121 of second, fourth, sixth, eighth-stage circuits 120-2, 120-4, 120-6, 120-8, whereby thyristors 121 of circuits 120-1 to 120-8 of the first to eighth stage are sequentially turned on in that order.

The gate potential of turned-on thyristor 121 is substantially H level and the gate potential of turned-off thyristor 121 is L level substantially equal to ground (GND) potential. The gate potential of thyristor 121 of each circuit 120-1 to 120-8 is a signal of each output terminal Q1 to Q8 in shift register 110A. Therefore, Embodiment 2 obtains signals from output terminals Q1 to Q8 that are the same or similar signals to those of Embodiment 1 shown in FIG. 8, sequentially turning on light emitting thyristors 210-1 to 210-8 that are selected by the light emission instruction from shift register 110 A.

(Effects According to Embodiment 2)

According to Embodiment 2, there are similar effects as Embodiment 1, as well as effect (4) described below.

(4) According to Embodiment 2, self scanning type shift register 110A to sequentially turn on light emitting thyristors 210-1 to 210-n is configured by using self scanning type thyristors 121. Accordingly, Embodiment 2 does not need shift register 110, which is required in Embodiment 1, formed on the silicon substrate. Therefore, self scanning type shift register 110A and light emitting element array 200 can be monolithically-integrated to realize downsizing.

[Embodiment 3]

(Printing Controller and Print Head According to Embodiment 3)

Figure 13:
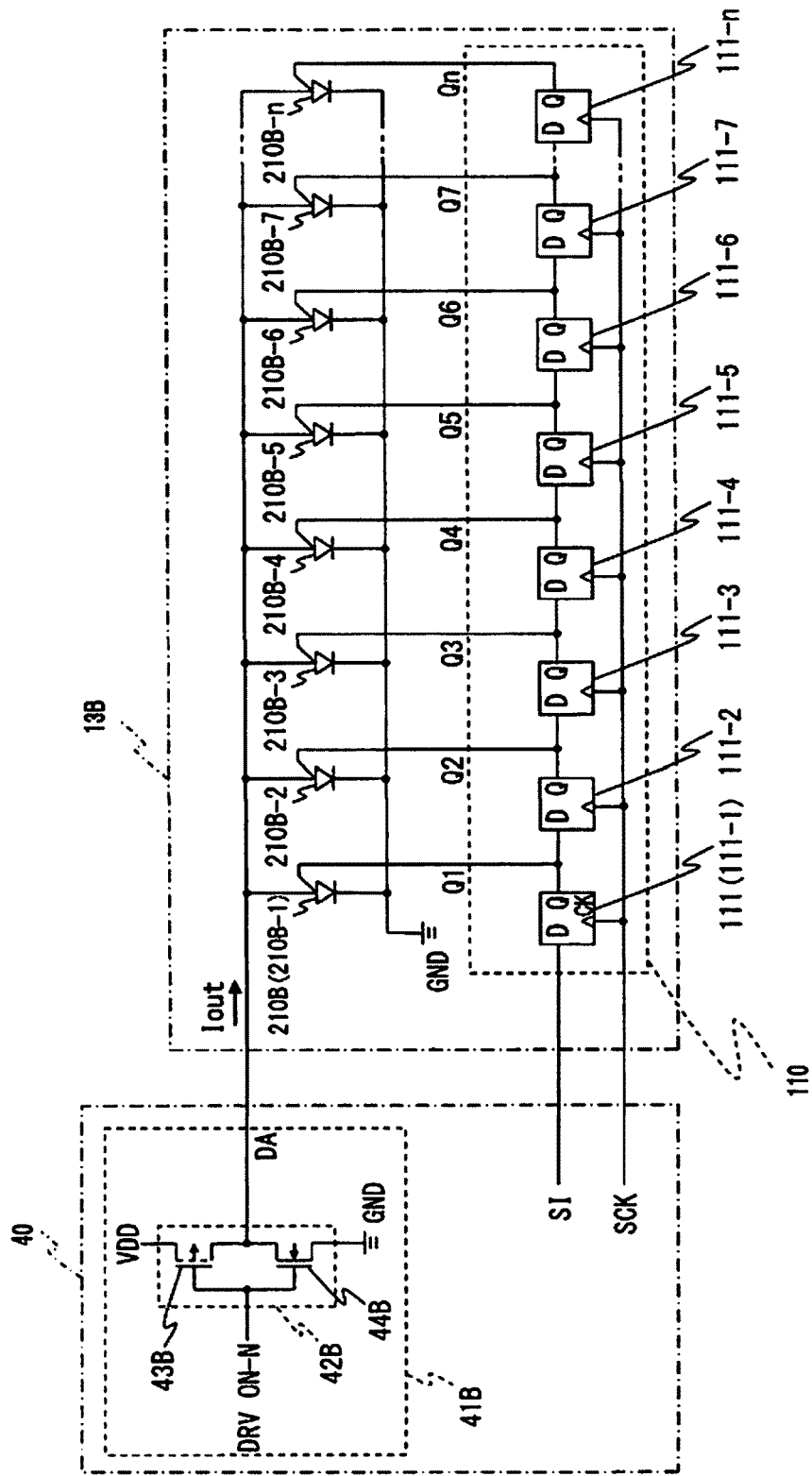
FIG. 13 is a block diagram illustrating a circuit configuration of a printing controller and a print head according to Embodiment 3 of the invention.

FIG. 13 is a block diagram illustrating a schematic circuit configuration of a printing controller and a print head in Embodiment 3 of the invention, in which common signs are assigned to elements common to those in FIG. 1 showing Embodiment 1.

In image forming apparatus 1 according to Embodiment 3, a circuit configuration of print head 13B and printing controller 40B is different from print head 13 and printing controller 40 according to Embodiment 1.

Print head 13B according to Embodiment 3 includes shift register 110 similar with Embodiment 1 and light emitting element array 200B of a configuration different from light emitting element array 200 according to Embodiment 1.

Light emitting element array 200B includes three-terminal light emitting elements which are, for example, a plurality of N-gate type light emitting thyristors 210B (210B-1 to 210B-n, . . . ). A first terminal (for example, cathode) of each light emitting thyristor 210B is connected to a first power supply (for example, ground GND (=0V)), a second terminal (for example, anode) thereof is connected to common terminal IN flowing drive current Iout, and a first control terminal (for example, gate) thereof is connected to output terminals Q1 to Qn of shift register 110. Light emitting thyristors 210B are elements which emit light, with supply voltage VDD applied between the anode and cathode, when cathode current flows with the anode-to-cathode turned on by input of L level trigger signal into the gate.

Printing controller 40B includes: a circuit (not shown) which supplies ON/OFF command signal DRVON-N (Note that "-N" represents negative logic) which instructs ON/OFF of light emitting element array 200B, serial data SI and serial clock SCK (control signals with respect to shift register 110) to print head 13B; and a plurality of drive circuit 41 which drives a plurality of light emitting element arrays 200B in a time division manner; a second power supply (VDD power supply); ground GRD; and the like. Similarly with Embodiment 1, FIG. 13 shows only one drive circuit 41B in order to simplify explanation. The plurality of light emitting element arrays 200B includes, for example, 4992 light emitting thyristors 210B-1 to 210B-n, . . . in total, which are grouped to a plurality of groups each including light emitting thyristors 210B-1 to 210B-n and which are driven by drive circuit 41B provided per group in parallel in a divided manner.

Further, drive circuit 41B disposed inside printing controller 40B in FIG. 13 may be disposed inside print head 13B.

Drive circuit 41B includes CMOS inverter 42B which inverts and outputs ON/OFF command signal DVRON-N to data terminal DA. CMOS inverter 42B includes MOS transistor (for example, PMOS) 43B of first conductive type having a characteristic of Embodiment 3 and normal MOS transistor (for example, NMOS) 44B of second conductive type, which are connected in series with each other between VDD power supply and ground GND.

That is, PMOS 43B includes a second control terminal (for example, a gate) to which ON/OFF command signal DVRON-N is input, a third terminal (for example, a source) which is connected to VDD power supply, and a fourth terminal (for example, a drain) which is connected to data terminal DA. NMOS 44B includes a gate to which ON/OFF command signal DRVON-N is input, a source which is connected to ground GND, a drain which is connected to data terminal DA. Data terminal DA is connected to common terminal IN on the side of light emitting element array 200B.

PMOS 43B, which is a feature of Embodiment 3, is formed in the N-type silicon wafer substrate or in the substrate region (for example, N-well region) in the N-type silicon wafer substrate, and N-type impurity such as arsenic As or the like is injected in the channel formation region between the source region and the drain region. With this configuration, the absolute value of threshold voltage Vtp of PMOS 43B can be higher than those of other PMOSs (not shown). Note that since the threshold voltage of a PMOS is a negative value in general, the absolute value of threshold voltage Vtp is used for comparison. Here, threshold voltage Vtp of PMOS 43B can be adjusted by adjusting the amount of the N-type impurity injected in the channel formation region.

A drive device according to Embodiment 3 includes drive circuit 41B and the like on the side of printing controller 40B, and shift register 110 on the side of print head 13B.

(Operations of Printing Controller and Print Head According to Embodiment 3)

In FIG. 13, for example, when ON/OFF command signal DRVON-N in printing controller 40B is at H level, PMOS 43B constituting CMOS inverter 42B is turned off, NMOS 44B is turned on, and data terminal DA on the output side is at L level (=ground potential). Consequently, voltage of common terminal IN on the side of print head 13B becomes substantially the ground potential, anode-to-cathode voltage of respective light emitting thyristors 210B becomes substantially zero, drive current Iout flowing thereto becomes zero, and all of light emitting thyristors 210B to 210B-n are in the state in which no light is emitted.

On the contrary, when ON/OFF command signal DRVON-N is at L level, PMOS 43B constituting CMOS inverter 42B is turned ON, NMOS 44B is turned OFF, and data terminal DA on the output side is at H level (≈supply voltage VDD). Consequently, common terminal IN on the side of print head 13B also turns at substantial supply voltage VDD, and substantial supply voltage VDD is applied between the anode and the cathode of respective light emitting thyristors 210B. At that time, only light emitting thyristors 210B instructed to emit light are turned on by selectively turning only gates of instructed light emitting thyristors 210B out of light emitting thyristors 210B-1 to 210B-n to L level to cause the trigger current to flow the gates of instructed light emitting thyristors 210B.

Current flowing into a cathode of turned-on light emitting thyristor 210B is a current flowing into data terminal DA (that is, drive current Iout), turning light emitting thyristor 210B to a light emitting state, and thereby generates light output corresponding to the value of drive current Iout.

Considering a specific design example, for example, supply voltage VDD is set to 3.3V. In this case, when PMOS 43B is turned on, supply voltage VDD is applied between the gate and the source, the voltage being 3.3V at most but enough to operate PMOS 43B in the saturation region by increasing threshold voltage Vtp.

As well known from a theory of electronic device physics, drain current Id of PMOS 43B at that time is given by the following formula.

$$Id = K \times (W/L) \times (Vgs - Vtp)^2$$

Where;
W: Gate width of PMOS 43B
L: Gate length of PMOS 43B
Vtp: Threshold voltage of NPMOS 44B
Vgs: Gate-to-source voltage of PMOS 43B (≈supply voltage VDD)

As is apparent from the above formula, drain current Id of PMOS 43B, that is, drive current Iout of light emitting thyristor 210B can be varied by adjusting the potential of threshold voltage Vtp of PMOS 43B and thus drain current Id can be adjusted by changing the amount of the N-type impurity injected into the channel formation region.

Although drive circuit 41B shown in FIG. 13 is provided with NMOS 44B to turn data terminal DA to L level, light emitting thyristors 210B-1 to 210B-n can be turned off by shutting off drive current Iout with PMOS 43B turned off. Therefore, NMOS 44B may be omitted in a case where high speed switching of light emitting thyristor 210B is not required.

(Advantageous Effects According to Embodiment 3)

According to Embodiment 3, there are almost the same effects as those according to Embodiment 1. Further, almost same effects as those according to Embodiment 2 can be obtained by replacing shift register 110 with clock drive circuit 45 and self-scanning type shift register 110A shown in FIG. 11 of Embodiment 2.

(Modified Example)

The invention is not limited to embodiments 1 to 3 described above but may be modified for a variety of utilizations such as, for example, (I) and (II) described below.

(I) Although the cases where the invention is applied to light emitting thyristors 210 and 210B as a light source are described in Embodiments 1 to 3, the invention may be applied to a case where thyristors are used as switching elements and voltage applied to another element (for example, organic electroluminescent element (hereinafter referred to as "organic EL element"), display element, and the like) which is, for example, connected in series with the switching elements. For example, the invention may be utilized for a printer provided with an organic EL print head including organic EL element arrays, a display device including display element arrays, and the like.

(II) The invention also may be applied to a thyristor used as a switching element to drive (that is, to control voltage application of) a display element (for example, display element arrayed in rows or matrix). Further, the invention also may be applied not only to a thyristor including a three-terminal structure but also to a four-terminal thyristor SCS (Silicon Semiconductor Controlled Switch) including two gates, that is, first and second gates.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A drive device configured to drive a plurality of three-terminal light emitting elements each comprising: a first terminal connected to a first power supply; a second terminal configured to enable drive current flow to the first terminal from the second terminal, and a control terminal configured to control the conduction state between the first terminal and the second terminal, the first terminals of the plurality of three-terminal light emitting elements being connected in common, the second terminals of the plurality of three-terminal light emitting elements being connected in common, the drive device comprising:
a drive circuit, including a first MOS transistor having a first conductive type and a second MOS transistor having a second conductive type different from that of the first MOS transistor, the first MOS transistor and the second MOS transistor being complementarily connected to each other, and configured to drive three-terminal light emitting elements that are in conduction state among the plurality of three-terminal light emitting elements based on a received drive signal, wherein the first MOS transistor includes:
a well region having the second conductive type and formed at a substrate;
a source region having the first conductive type and formed at the well region;
a drain region having the first conductive type and formed at the well region;
a source terminal formed at the source region and connected to a second power supply having a potential different from the potential of the first power supply;
a drain terminal formed at the drain region and connected to the second terminals of the plurality of three-terminal light emitting elements connected in common;

a gate terminal configured to control the conduction state between the source terminal and the drain terminal based on the drive signal; and a channel formation region, which is a region wherein a channel is to be formed, and which is formed between the source region and the drain region, the channel formation region having an impurity having the second conductive type injected therein such that an output equivalent resistance value of the drive circuit is higher than an absolute value of a maximum value of negative resistance determined by a turn-on characteristic of the light emitting elements, wherein a threshold voltage of the first MOS transistor is increased in such a manner that the first MOS transistor exhibits a constant current property.

2. The drive device according to claim 1, wherein the potential of the first power supply is a power supply potential, the potential of the second power supply is a ground potential, the first MOS transistor is an N-channel MOS transistor, and the second MOS transistor is a P-channel MOS transistor.

3. The drive device according to claim 1, wherein the potential of the first power supply is a ground potential, the potential of the second power supply is a power supply potential, the first MOS transistor is a P-channel MOS transistor, and the second eenductive-type MOS transistor is an N-channel MOS transistor.

4. The drive device according to claim 1, wherein each of the three-terminal light emitting elements is a light emitting thyristor.

5. The drive device according to claim 1, further comprising a shift register configured to turn the three-terminal light emitting elements on by providing trigger signals to the control terminals in the three-terminal light emitting elements.

6. The drive device according to claim 5, wherein the shift register includes multi-stage flip-flop circuits being cascade-connected and is configured to input serial data based on a serial clock signal and to sequentially output the trigger signals from the multi-stage flip-flop circuits.

7. The drive device according to claim 5, wherein the shift register includes a self-scanning type circuit having three-terminal switching elements and is configured to sequentially output the trigger signals based on a clock signal.

8. A print head comprising:

the plurality of three-terminal light emitting elements and the drive device according to claim 5.

9. An image forming apparatus comprising the print head according to claim 8, wherein the print head emits light to form an image on a recording medium.

10. An image forming apparatus comprising the print head according to claim 8 to emit light;

an image carrier configured to have a latent image formed thereon by receiving the light emitted from the print head;

a development unit configured to form a developer image on the image carrier by developing the latent image on the image carrier with a developer;

a transfer unit configured to transfer the developer image onto a recording medium; and a fixing unit configured to fix the developer image to the recording medium.

11. The drive device according to claim 1, wherein the drain terminal of the first MOS transistor is directly connected with the second terminal of each of the three-terminal light emitting elements.

* * * * *